US007567675B2

(12) United States Patent
Bharitkar et al.

(10) Patent No.: US 7,567,675 B2
(45) Date of Patent: Jul. 28, 2009

(54) SYSTEM AND METHOD FOR AUTOMATIC MULTIPLE LISTENER ROOM ACOUSTIC CORRECTION WITH LOW FILTER ORDERS

(75) Inventors: Sunil Bharitkar, Los Angeles, CA (US); Chris Kyriakakis, Alta Dena, CA (US)

(73) Assignee: Audyssey Laboratories, Inc., Los Angeles, CA (US)

( * ) Notice: Subject to any disclaimer, the term of this patent is extended or adjusted under 35 U.S.C. 154(b) by 732 days.

(21) Appl. No.: 10/700,220

(22) Filed: Nov. 3, 2003

(65) Prior Publication Data

US 2005/0094821 A1 May 5, 2005

Related U.S. Application Data

(63) Continuation-in-part of application No. 10/465,644, filed on Jun. 20, 2003.

(60) Provisional application No. 60/390,122, filed on Jun. 21, 2002.

(51) Int. Cl.
*H04R 5/00* (2006.01)
*H03G 3/00* (2006.01)
*H04R 5/02* (2006.01)

(52) U.S. Cl. ............................ 381/17; 381/61; 381/63; 381/18; 381/19; 381/307

(58) Field of Classification Search ............ 381/17–19, 381/58, 61, 63, 77, 307, 309
See application file for complete search history.

(56) References Cited

U.S. PATENT DOCUMENTS

| | | | | |
|---|---|---|---|---|
| 5,771,294 | A * | 6/1998 | Inoue et al. | 381/17 |
| 6,072,877 | A * | 6/2000 | Abel | 381/17 |
| 6,118,875 | A * | 9/2000 | Moller et al. | 381/1 |
| 6,792,114 | B1 * | 9/2004 | Kates et al. | 381/60 |
| 6,956,955 | B1 * | 10/2005 | Brungart | 381/310 |
| 6,980,665 | B2 * | 12/2005 | Kates | 381/312 |
| 2003/0200236 | A1 * | 10/2003 | Hong | 708/200 |
| 2003/0235318 | A1 * | 12/2003 | Bharitkar et al. | 381/304 |

* cited by examiner

*Primary Examiner*—Vivian Chin
*Assistant Examiner*—George C Monikang
(74) *Attorney, Agent, or Firm*—Foley & Lardner LLP; Steven A. Moore

(57) ABSTRACT

A system and a method for correcting, simultaneously at multiple-listener positions, distortions introduced by the acoustical characteristics includes warping room responses, intelligently weighing the warped room acoustical responses to form a weighted response, a low order spectral fitting to the weighted response, forming a warped filter from the low order spectral fit, and unwarping the warped filter to form the room acoustical correction filter.

19 Claims, 24 Drawing Sheets

SYSTEM AND METHOD FOR AUTOMATIC MULTIPLE LISTENER ROOM ACOUSTIC CORRECTION WITH LOW FILTER ORDERS

CROSS-REFERENCE TO RELATED APPLICATIONS

The present application is a continuation-in-part of and claims priority to U.S. application Ser. No. 10/465,644 filed Jun. 20, 2003 which claims the benefit of priority to U.S. Provisional Patent Application 60/390,122 filed Jun. 21, 2002, which are incorporated by reference in their entirety herein.

BACKGROUND

1. Field of the Invention

The present invention relates to multi-channel audio and particularly to the delivery of high quality and distortion-free multi-channel audio in an enclosure.

2. Description of the Background Art

The inventors have recognized that the acoustics of an enclosure (e.g., room, automobile interior, movie theaters, etc.) play a major role in introducing distortions in the audio signal perceived by listeners.

A typical room is an acoustic enclosure that can be modeled as a linear system whose behavior at a particular listening position is characterized by an impulse response, $h(n)$ $\{n=0, 1, \ldots, N-1\}$. This is called the room impulse response and has an associated frequency response, $H(e^{j\omega})$. Generally, $H(e^{j\omega})$ is also referred to as the room transfer function (RTF). The impulse response yields a complete description of the changes a sound signal undergoes when it travels from a source to a receiver (microphone/listener). The signal at the receiver contains consists of direct path components, discrete reflections that arrive a few milliseconds after the direct sound, as well as a reverberant field component.

It is well established that room responses change with source and receiver locations in a room. A room response can be uniquely defined for a set of spatial co-ordinates $(x_i, y_i, z_i)$. This assumes that the source (loudspeaker) is at origin (0, 0, 0) and the receiver (microphone or listener) is at the spatial co-ordinates, $x_i$, $y_i$ and $z_i$, relative to a source in the room.

Now, when sound is transmitted in a room from a source to a specific receiver, the frequency response of the audio signal is distorted at the receiving position mainly due to interactions with room boundaries and the buildup of standing waves at low frequencies.

One mechanism to minimize these distortions is to introduce an equalizing filter that is an inverse (or approximate inverse) of the room impulse response for a given source-receiver position. This equalizing filter is applied to the audio signal before it is transmitted by the loudspeaker source. Thus, if $h_{eq}(n)$ is the equalizing filter for $h(n)$, then, for perfect equalization $h_{eq}(n) \otimes h(n)=\delta(n)$; where $\otimes$ is the convolution operator and $\delta(n)$ is the Kronecker delta function.

However, the inventors have realized that at least two problems arise when using this approach, (i) the room response is not necessarily invertible (i.e., it is not minimum phase), and (ii) designing an equalizing filter for a specific receiver (or listener) will produce poor equalization performance at other locations in the room. In other words, multiple-listener equalization cannot be achieved with a single equalizing filter. Thus, room equalization, which has traditionally been approached as a classic inverse filter problem, will not work in practical environments where multiple-listeners are present.

Furthermore, it is required that for real-time digital signal processing, low filter orders are required. Given this, there is a need to develop a system and a method for correcting distortions introduced by the room, simultaneously, at multiple-listener positions using low filter orders.

SUMMARY OF THE INVENTION

The present invention provides a system and a method for delivering substantially distortion-free audio, simultaneously, to multiple listeners in any environment (e.g., free-field, home-theater, movie-theater, automobile interiors, airports, rooms, etc.). This is achieved by means of a filter that automatically corrects the room acoustical characteristics at multiple-listener positions.

Accordingly, in one embodiment, the method for correcting room acoustics at multiple-listener positions comprises: (i) measuring a room acoustical response at each listener position in a multiple-listener environment; (ii) determining a general response by computing a weighted average of the room acoustical responses; and (iii) obtaining a room acoustic correction filter from the general response, wherein the room acoustic correction filter corrects the room acoustics at the multiple-listener positions. The method may further include the step of generating a stimulus signal (e.g., a logarithmic chirp signal, a broadband noise signal, a maximum length signal, or a white noise signal) from at least one loudspeaker for measuring the room acoustical response at each of the listener position.

In one aspect of the invention, the general response is determined by a pattern recognition method such as a hard c-means clustering method, a fuzzy c-means clustering method, any well known adaptive learning method (e.g., neural-nets, recursive least squares, etc.), or any combination thereof.

The method may further include the step of determining a minimum-phase signal and an all-pass signal from the general response. Accordingly, in one aspect of the invention, the room acoustic correction filter could be the inverse of the minimum-phase signal. In another aspect, the room acoustic correction filter could be the convolution of the inverse minimum-phase signal and a matched filter that is derived from the all-pass signal.

Thus, filtering each of the room acoustical responses with the room acoustical correction filter will provide a substantially flat magnitude response in the frequency domain, and a signal substantially resembling an impulse function in the time domain at each of the listener positions.

In another embodiment of the present invention, the method for generating substantially distortion-free audio at multiple-listeners in an environment comprises: (i) measuring the acoustical characteristics of the environment at each expected listener position in the multiple-listener environment; (ii) determining a room acoustical correction filter from the acoustical characteristics at the each of the expected listener positions; (iii) filtering an audio signal with the room acoustical correction filter; and (iv) transmitting the filtered audio from at least one loudspeaker, wherein the audio signal received at said each expected listener position is substantially free of distortions.

The method may further include the step of determining a general response, from the measured acoustical characteristics at each of the expected listener positions, by a pattern recognition method (e.g., hard c-means clustering method, fuzzy c-means clustering method, a suitable adaptive learning method, or any combination thereof). Additionally, the method could include the step of determining a minimum-phase signal and an all-pass signal from the general response.

In one aspect of the invention, the room acoustical correction filter could be the inverse of the minimum-phase signal, and in another aspect of the invention, the filter could be obtained by filtering the minimum-phase signal with a matched filter (the matched filter being obtained from the all-pass signal).

In one aspect of the invention, the pattern recognition method is a c-means clustering method that generates at least one cluster centroid. Then, the method may further include the step of forming the general response from the at least one cluster centroid.

Thus, filtering each of the acoustical characteristics with the room acoustical correction filter will provide a substantially flat magnitude response in the frequency domain, and a signal substantially resembling an impulse function in the time domain at each of the expected listener positions.

In one embodiment of the present invention, a system for generating substantially distortion-free audio at multiple-listeners in an environment comprises: (i) a multiple-listener room acoustic correction filter implemented in the semiconductor device, the room acoustic correction filter formed from a weighted average of room acoustical responses, and wherein each of the room acoustical responses is measured at an expected listener position, wherein an audio signal filtered by said room acoustic correction filter is received substantially distortion-free at each of the expected listener positions. Additionally, at least one of the stimulus signal and the filtered audio signal are transmitted from at least one loudspeaker.

In one aspect of the invention, the weighted average is determined by a pattern recognition system (e.g., hard c-means clustering system, a fuzzy c-means clustering system, an adaptive learning system, or any combination thereof). The system may further include a means for determining a minimum-phase signal and an all-pass signal from the weighted average.

Accordingly, the correction filter could be either the inverse of the minimum-phase signal or a filtered version of the minimum-phase signal (obtained by filtering the minimum-phase signal with a matched filter, the matched filter being obtained from the all-pass signal of the weighted average).

In one aspect of the invention, the pattern recognition means may be a c-means clustering system that generates at least one cluster centroid. Then, the system may further include means for forming the weighted average from the at least one cluster centroid.

Thus, filtering each of the acoustical responses with the room acoustical correction filter will provide a substantially flat magnitude response in the frequency domain, and a signal substantially resembling an impulse function in the time domain at each of the expected listener positions.

In another embodiment of the present invention, the method for correcting room acoustics at multiple-listener positions comprises: (i) clustering each room acoustical response into at least one cluster, wherein each cluster includes a centroid; (ii) forming a general response from the at least one centroid; and (iii) determining a room acoustic correction filter from the general response, wherein the room acoustic correction filter corrects the room acoustics at the multiple-listener positions.

In one aspect of the present invention, the method may further include the step of determining a stable inverse of the general response, the stable inverse being included in the room acoustic correction filter.

Thus, filtering each of the acoustical responses with the room acoustical correction filter will provide a substantially flat magnitude response in the frequency domain, and a signal substantially resembling an impulse function in the time domain at the multiple-listener positions.

In another embodiment of the present invention, the method for correcting room acoustics at multiple-listener positions comprises: (i) clustering a direct path component of each acoustical response into at least one direct path cluster, wherein each direct path cluster includes a direct path centroid; (ii) clustering reflection components of each of the acoustical response into at least one reflection path cluster, wherein said each reflection path cluster includes a reflection path centroid; (iii) forming a general direct path response from the at least one direct path centroid and a general reflection path response from the at least one reflection path centroid; and (iv) determining a room acoustic correction filter from the general direct path response and the general reflection path response, wherein the room acoustic correction filter corrects the room acoustics at the multiple-listener positions.

In another embodiment of the present invention, the method for correcting room acoustics at multiple-listener positions comprises: (i) determining a general response by computing a weighted average of room acoustical responses, wherein each room acoustical response corresponds to a sound propagation characteristics from a loudspeaker to a listener position; and (ii) obtaining a room acoustic correction filter from the general response, wherein the room acoustic correction filter corrects the room acoustics at the multiple-listener positions.

In another embodiment of the present invention, the method for correcting room acoustics at multiple-listener positions using low order room acoustical correction filters comprises the steps of: (i) measuring a room acoustical response at each listener position in a multiple-listener environment; (ii) warping each of the room acoustical response measured at said each listener position; (iii) determining a general response by computing a weighted average of the warped room acoustical responses; (iv) generating a low order spectral model of the general response; (v) obtaining a warped acoustic correction filter from the low order spectral model; and (vi) unwarping the warped acoustic correction filter to obtain a room acoustic correction filter; wherein the room acoustic correction filter corrects the room acoustics at the multiple-listener positions. The method may further including the step of generating and transmitting a stimulus signal (e.g., an MLS sequence, a logarithmic-chirp signal) for measuring the room acoustical response at each of the listener positions. The general response could be determined by a weighted average approach (as in through a pattern recognition method). The pattern recognition method could at least one of a hard c-means clustering method, a fuzzy c-means clustering method, or an adaptive learning method. The warping may be achieved by means of a bilinear conformal map. The spectral model includes at least one of a pole-zero model and Linear Predictive Coding (LPC) model. The warped acoustic correction filter is the inverse of the low order spectral model.

In another embodiment, a method for generating substantially distortion-free audio at multiple-listeners in an environment comprises: (i) measuring acoustical characteristics of the environment at each expected listener position in the multiple-listener environment; (ii) warping each of the acoustical characteristics measured at said each expected listener position; (iii) generating a low order spectral model of each of the warped acoustical characteristics; (iv) obtaining a warped acoustic correction filter from the low order spectral model;

(v) unwarping the warped acoustic correction filter to obtain a room acoustic correction filter; (vi) filtering an audio signal with the room acoustical correction filter; and (vii) transmitting the filtered audio from at least one loudspeaker, wherein the audio signal received at said each expected listener position is substantially free of distortions.

The system for generating substantially distortion-free audio at multiple-listeners in an environment comprises: a filtering means for performing multiple-listener room acoustic correction, the filtering means formed from: (a) warped room acoustical responses, wherein the room acoustical responses are measured at each of an expected listener position in a multiple-listener environment; (b) a weighted average response of the warped room acoustical responses; (c) a low order spectral model of the weighted average response; (d) a warped filter formed from the low order spectral model; and (e) an unwarped room acoustic correction filter obtained by unwarping the warped filter; wherein an audio signal, filtered by the filtering means comprised of the room acoustic correction filter, is received substantially distortion-free at each of the expected listener positions. The weighted average response may be determined by a pattern recognition means (at least one of a hard c-means clustering system, a fuzzy c-means clustering system, or an adaptive learning system), and the warping is achieved by an all-pass filter. The warped filter includes an inverse of the lower order spectral model (such as a frequency pole-zero model or an LPC model). Thus, filtering each of the acoustical responses with the room acoustical correction filter provides a substantially flat magnitude response at each of the listener positions.

In another embodiment of the present invention, a method for correcting room acoustics at multiple-listener positions comprises: (i) warping each room acoustical response, said each room acoustical response obtained at each expected listener position; (ii) clustering each of the warped room acoustical response into at least one cluster, wherein each cluster includes a centroid; (iii) forming a general response from the at least one centroid; (iv) inverting the general response to obtain an inverse response; (v) obtaining a lower order spectral model of the inverse response; (vi) unwarping the lower order spectral model of the inverse response to form the room acoustic correction filter; wherein the room acoustic correction filter corrects the room acoustics at the multiple-listener positions.

DESCRIPTION OF THE PREFERRED EMBODIMENTS

Figure 1:
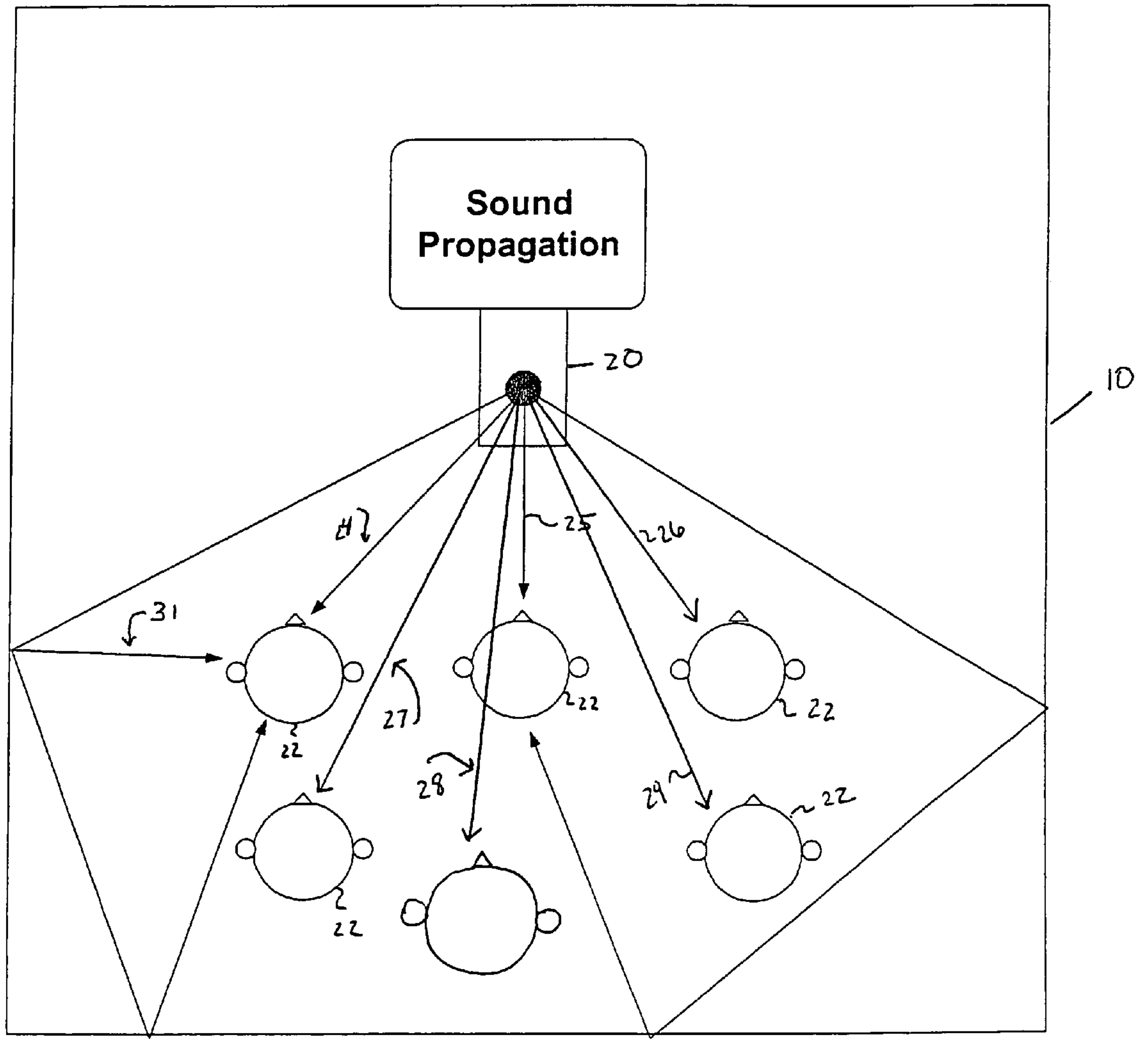
FIG. 1 shows the basics of sound propagation characteristics from a loudspeaker to a listener in an environment such as a room, movie-theater, home-theater, automobile interior.

FIG. 1 shows the basics of sound propagation characteristics from a loudspeaker (shown as only one for ease in depiction) 20 to multiple listeners (shown to be six in an exemplary depiction) 22 in an environment 10. The direct path of the sound, which may be different for different listeners, is depicted as 24, 25, 26, 27, 28, 29, and 30 for listeners one through six. The reflected path of the sound, which again may be different for different listeners, is depicted as 31 and is shown only for one listener here (for ease in depiction).

The sound propagation characteristics may be described by the room acoustical impulse response, which is a compact representation of how sound propagates in an environment (or enclosure). Thus, the room acoustical response includes the direct path and the reflection path components of the sound field. The room acoustical response may be measured by a microphone at an expected listener position. This is done by, (i) transmitting a stimulus signal (e.g., a logarithm chirp, a broadband noise signal, a maximum length signal, or any other signal that sufficiently excites the enclosure modes)

from the loudspeaker, (ii) recording the signal received at an expected listener position, and (iii) removing (deconvolving) the response of the microphone (also possibly removing the response associated with the loudspeaker).

Even though the direct and reflection path taken by the sound from each loudspeaker to each listener may appear to be different (i.e., the room acoustical impulse responses may be different), there may be inherent similarities in the measured room responses. In one embodiment of the present invention, these similarities in the room responses, between loudspeakers and listeners, may be used to form a room acoustical correction filter.

Figure 2:
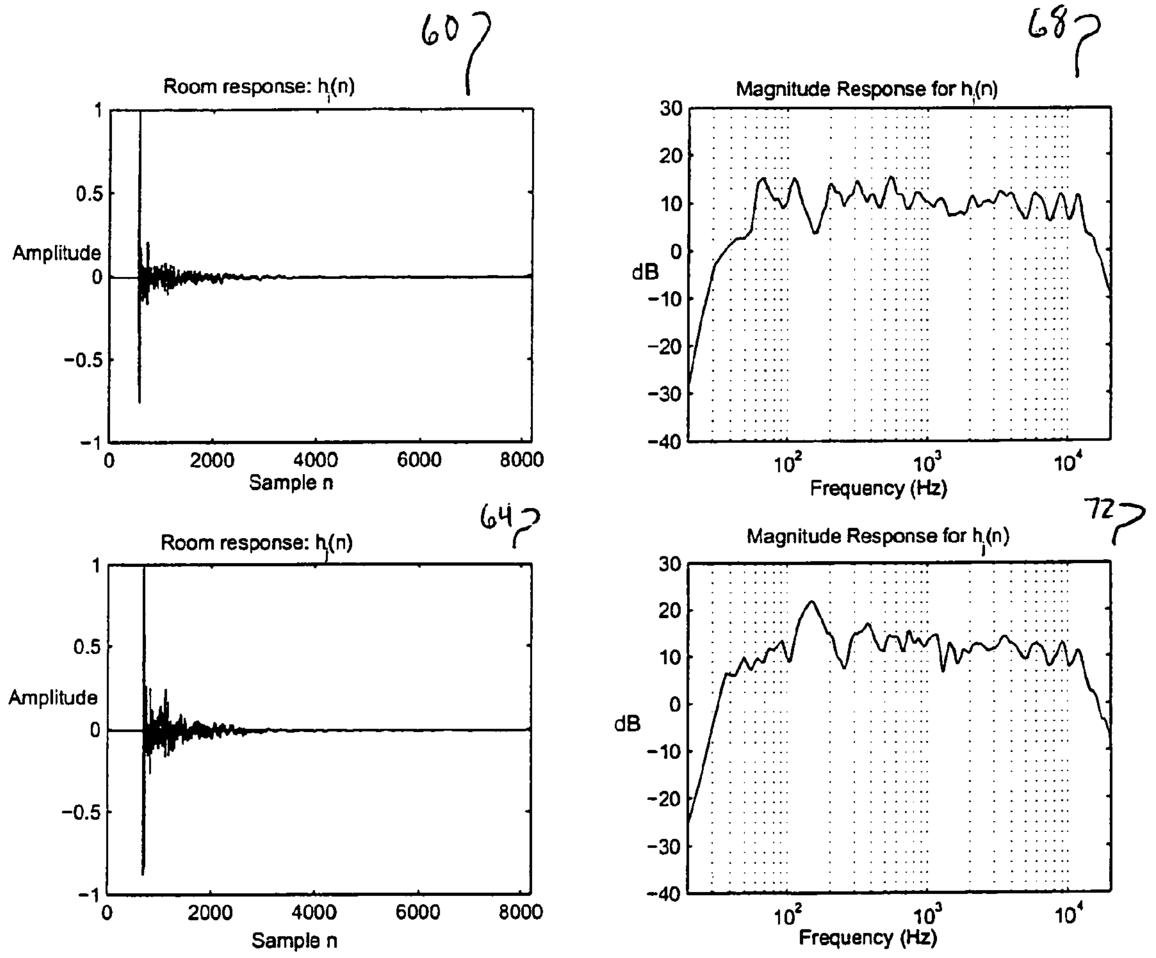
FIG. 2 shows an exemplary depiction of two responses measured in the same room a few feet apart.

FIG. 2 shows an exemplary depiction of two responses measured in the same room a few feet apart. The left panels 60 and 64 show the time domain plots, whereas the right panels 68 and 72 show the magnitude response plots. The room acoustical responses were obtained at two expected listener positions, in the same room. The time domain plots, 60 and 64, clearly show the initial peak and the early/late reflections. Furthermore, the time delay associated with the direct path and the early and late reflection components between the two responses exhibit different characteristics.

Furthermore, the right panels, 68 and 72, clearly show a significant amount of distortion introduced at various frequencies. Specifically, certain frequencies are boosted (e.g., 150 Hz in the bottom right panel 72), whereas other frequencies are attenuated (e.g., 150 Hz in the top right panel 68) by more than 10 dB. One of the objectives of the room acoustical correction filter is to reduce the deviation in the magnitude response, at all expected listener positions simultaneously, and make the spectrum envelopes flat. Another objective is to remove the effects of early and late reflections, so that the effective response (after applying the room acoustical correction filter) is a delayed Kronecker delta function, $\delta(n)$, at all listener positions.

Figure 3:
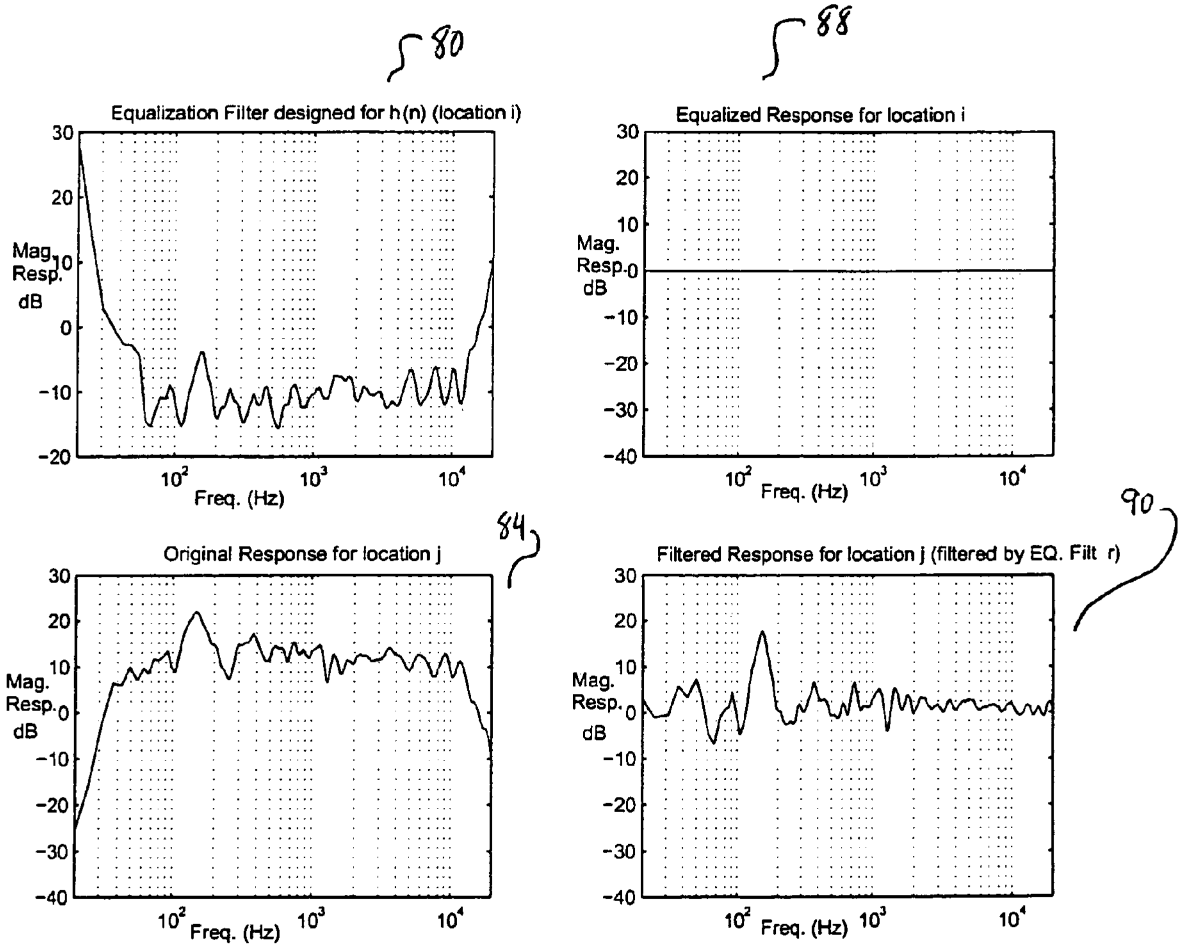
FIG. 3 shows frequency response plots that justify the need for performing multiple-listener equalization.

FIG. 3 shows frequency response plots that justify the need for performing multiple-listener room acoustical correction. Shown therein is the fact that, if an inverse filter is designed that "flattens" the magnitude response, at one position, then the response is degraded significantly in the other listener position.

Specifically, the top left panel 80 in FIG. 3 is the correction filter obtained by inverting the magnitude response of one position (i.e., the response of the top right panel 68) of FIG. 2. Upon using this filter, clearly the resulting response at one expected listener position is flattened (shown in top right panel 88). However, upon filtering the room acoustical response of the bottom left panel 84 (i.e., the response at another expected listener position) with the inverse filter of panel 80, it can be seen that the resulting response (depicted in panel 90) is degraded significantly. In fact there is an extra 10 dB boost at 150 Hz. Clearly, a room acoustical correction filter has to minimize the spectral deviation at all expected listener positions simultaneously.

Figure 4:
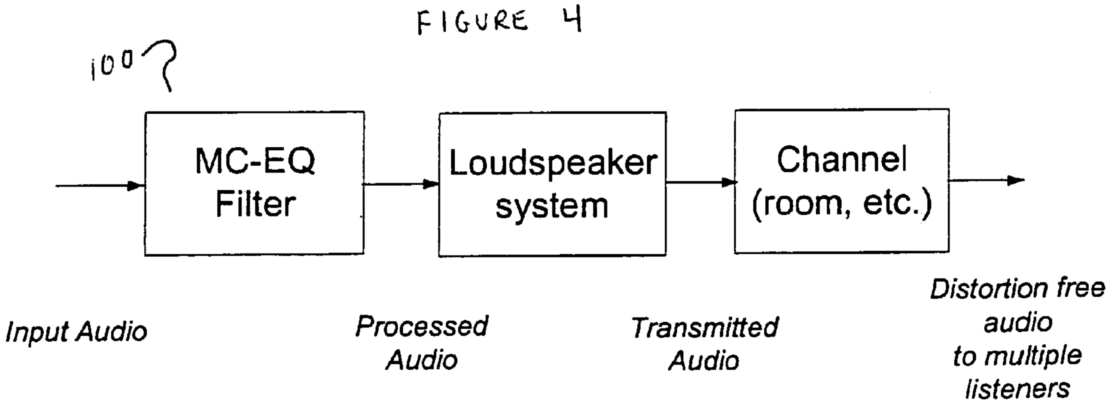
FIG. 4 depicts a block diagram overview of a multiple-listener equalization system (i.e., the room acoustical correction system), including the room acoustical correction filter and the room acoustical responses at each expected listener position.

FIG. 4 depicts a block diagram overview of the multiple-listener equalization system. The system includes the room acoustical correction filter 100, of the present invention, which preprocesses or filters the audio signal before transmitting the processed (i.e., filtered) audio signal by loudspeakers (not shown). The loudspeakers and room transmission characteristics (simultaneously called the room acoustical response) are depicted as a single block 102 (for simplicity). As described earlier, and is well known in the art, the room acoustical responses are different for each expected listener position in the room.

Since the room acoustical responses are substantially different for different source-listener positions, it seems natural that whatever similarities reside in the responses be maximally utilized for designing the room acoustical correction filter 100. Accordingly, in one aspect of the present invention, the room acoustical correction filter 100 may be designed using a "similarity" search algorithm or a pattern recognition algorithm/system. In another aspect of the present invention, the room acoustical correction filter 100 may be designed using a weighted average scheme that employs the similarity search algorithm. The weighted average scheme could be a recursive least squares scheme, a scheme based on neural-nets, an adaptive learning scheme, a pattern recognition scheme, or any combination thereof.

In one aspect of the present invention, the "similarity" search algorithm is a c-means algorithm (e.g., the hard c-means of fuzzy c-means, also called k-means in some literatures). The motivation for using a clustering algorithm, such as the fuzzy c-means algorithm, is described with the aid of FIG. 5.

Figure 5:
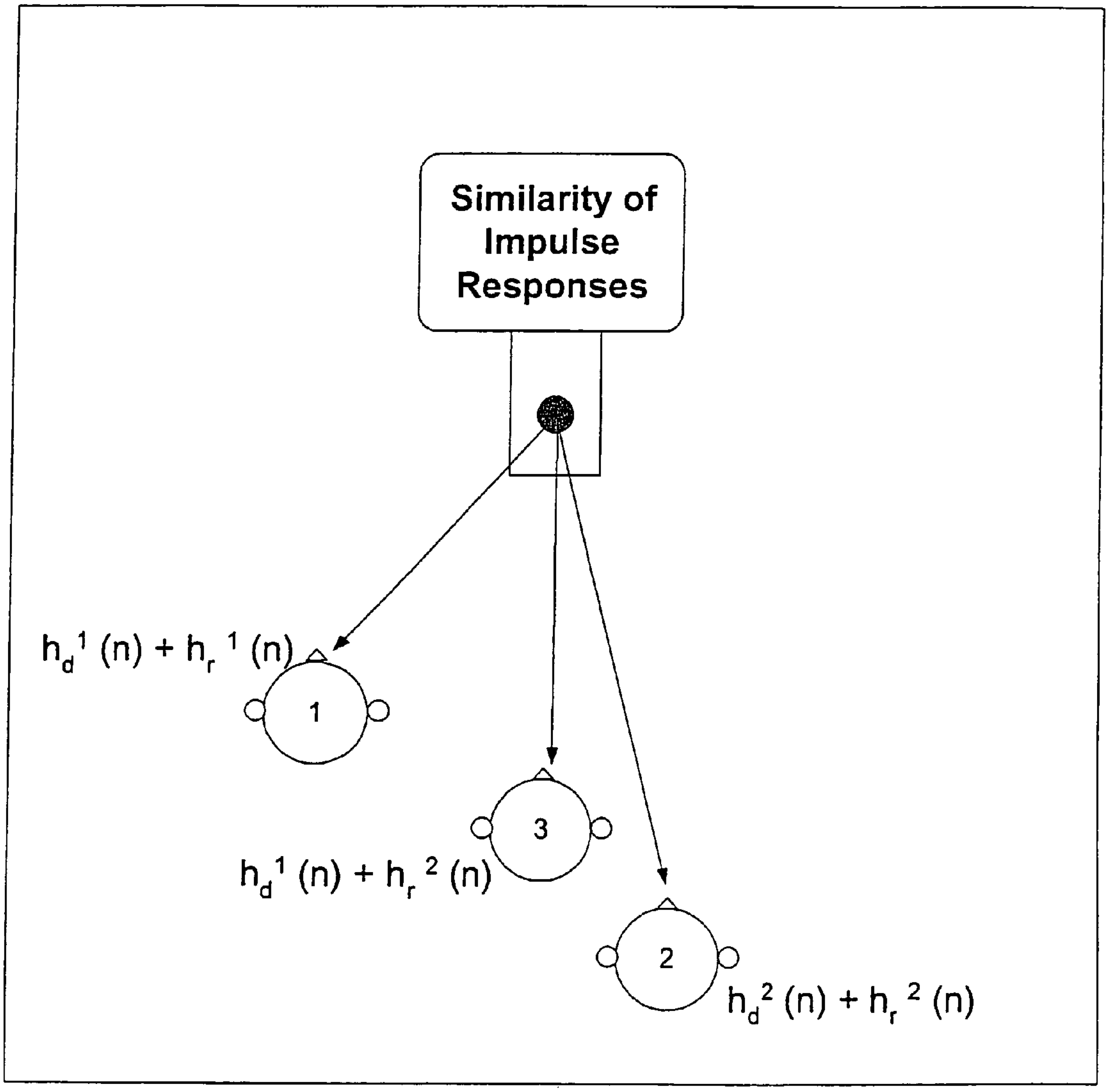
FIG. 5 shows the motivation for using the weighted averaging process (or means) for performing multiple-listener equalization.

FIG. 5 shows the motivation for using the fuzzy c-means algorithm for designing the room acoustical correction filter 100 for performing simultaneous multiple-listener equalization. Specifically, there is a high likelihood that the direct path component of the room acoustical response associated with listener 3 is similar (in the Euclidean sense) to the direct path component of the room acoustical response associated with listener 1 (since listener 1 and 3 are at same radial distance from the loudspeaker). Furthermore, it may so happen that the reflective component of listener 3 room acoustical response may be similar to the reflective component of listener 2 room acoustical response (due to the proximity of the listeners). Thus, it is clear that if responses 1 and 2 are clustered separately, due to their "dissimilarity", then response 3 should belong to the both clusters to some degree. Thus, this clustering approach permits an intuitively "sound" model for performing room acoustical correction.

The fuzzy c-means clustering procedures use an objective function, such as a sum of squared distances from the cluster room response prototypes, and seek a grouping (cluster formation) that extremizes the objective function. Specifically, the objective function, $J_\kappa(.,.)$, to minimize in the fuzzy c-means algorithm is:

$$J_\kappa\left(U_{cxN}, \underline{\hat{h}}_i^*\right) = \sum_{i=1}^{c} \sum_{k=1}^{N} (\mu_i(\underline{h}_k))^*(d_{ik})^2$$

$$\mu_i(\underline{h}_k) \in U_{cxN};\ \mu_i(\underline{h}_k) \in [0, 1]$$

$$\underline{\hat{h}}_i^* = (\underline{\hat{h}}_1^*, \underline{\hat{h}}_2^*, \ldots, \underline{\hat{h}}_c^*);\ d_{ik}^2 = \left\|\underline{h}_k - \underline{\hat{h}}_i^*\right\|^2$$

In the above equation, $\underline{\hat{h}}_i^*$, denotes the i-th cluster room response prototype (or centroid), $\underline{h}_k$ is the room response expressed in vector form (i.e., $\underline{h}_k=(h_i(n);n=0,1,\ldots)=(h_i(0),h_i(1),\ldots,h_i(M-1))^T$ and T represents the transpose operator), N is the number of listeners, c denotes the number of clusters (c was selected as $\sqrt{N}$, but could be some value less than N), $\mu_i(\underline{h}_k)$ is the degree of membership of acoustical response k in cluster i, $d_{ik}$ is the distance between centroid $\underline{\hat{h}}_i^*$ and response $\underline{h}_k$, and $\kappa$ is a weighting parameter that controls the fuzziness in the clustering procedure. When $\kappa=1$, fuzzy c-means algorithm approaches the hard c-means algorithm. The parameter $\kappa$ was set at 2 (although this could be set to a different value between 1.25 and infinity). It can be shown that on setting the following:

$$\partial J_2(\_)/\partial \underline{\hat{h}}_i^*=0 \text{ and } \partial J_2(\_)/\partial \mu_i(\underline{h}_k)=0$$

yields:

$$\hat{h}_i^* = \frac{\sum_{k=1}^{N} (\mu_i(\underline{h}_k))^2 \underline{h}_k}{\sum_{k=1}^{N} (\mu_i(\underline{h}_k))^2}$$

$$\mu_i(\underline{h}_k) = \left[\sum_{j=1}^{c}\left(\frac{d_{ik}^2}{d_{jk}^2}\right)\right]^{-1} = \frac{\frac{1}{d_{ik}^1}}{\sum_{j=1}^{c}\frac{1}{d_{jk}^2}}; i = 1, 2, \ldots, c; k = 1, 2, \ldots, N$$

An iterative optimization was used for determining the quantites in the above equations. In the trivial case when all the room responses belong to a single cluster, the single cluster room response prototype $\underline{\hat{h}}_i$* is the uniform weighted average (i.e., a spatial average) of the room responses since, $\mu_i(\underline{h}_k)=1$, for all k. In one aspect of the present invention for designing the room acoustical correction filter, the resulting room response formed from spatially averaging the individual room responses at multiple locations is stably inverted to form a multiple-listener room acoustical correction filter. In reality, the advantage of the present invention resides in applying non-uniform weights to the room acoustical responses in an intelligent manner (rather than applying equal weighting to each of these responses).

After the centroids are determined, it is required to form the room acoustical correction filter. The present invention includes different embodiments for designing multiple-listener room acoustical correction filters.

Figure 6:
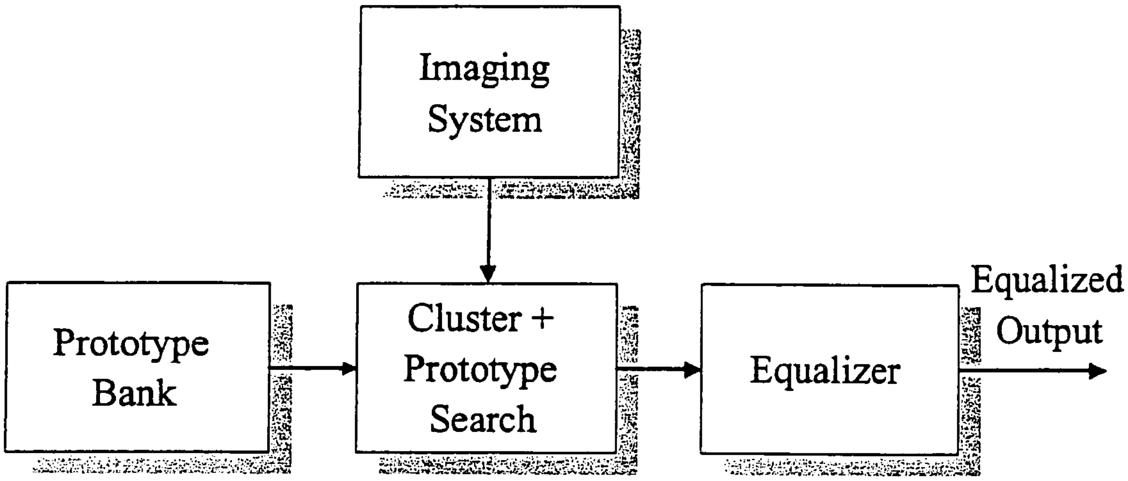
FIG. 6 shows one embodiment for designing the room acoustical correction filter.

A. Spatial Equalizing Filter Bank:

FIG. 6 shows one embodiment for designing the room acoustical correction filter with a spatial filter bank. The room responses, at locations where the responses need to be corrected (equalized), may be obtained a priori. The c-means clustering algorithm is applied to the acoustical room responses to form the cluster prototypes. As depicted by the system in FIG. 6, based on the location of a listener "i", an algorithm determines, through the imaging system, to which cluster the response for listener "i" may belong. In one aspect of the invention, the minimum phase inverse of the corresponding cluster centroid is applied to the audio signal, before transmitting through the loudspeaker, thereby correcting the room acoustical characteristics at listener "i".

B. Combining the Acoustical Room Responses using Fuzzy Membership Functions:

The objective may be to design a single equalizing or room acoustical correction filter (either for each loudspeaker and multiple-listener set, or for all loudspeakers and all listeners), using the prototypes or centroids $\underline{\hat{h}}_i$*. In one embodiment of the present invention, the following model is used:

$$\underline{h}_{final} = \frac{\sum_{j=1}^{c}\left(\sum_{k=1}^{N}(\mu_j(\underline{h}_k))^2\right)\hat{\underline{h}}_j^*}{\sum_{j=1}^{c}\left(\sum_{k=1}^{N}(\mu_j(h_k))^2\right)}$$

$\underline{h}_{final}$ is the general response (or final prototype) obtained by performing a weighted average of the centroids $\underline{\hat{h}}_i$*. The weights for each of the centroids, $\underline{\hat{h}}_i$*, is determined by the "weight" of that cluster "i", and is expressed as:

$$weight_i = \frac{\sum_{k=1}^{N}\mu_i(\underline{h}_k)^2}{\sum_{i=1}^{c}\sum_{k=1}^{N}\mu_i(\underline{h}_k)^2}$$

It is well known in the art that any signal can be decomposed into its minimum-phase part and its all-pass part. Thus, $$h_{final}(n)=h_{min,final}(n)h_{ap,final}(n)$$

The multiple-listener room acoustical correction filter is obtained by either of the following means, (i) inverting $\underline{h}_{final}$, (ii) inverting the minimum phase part, $\underline{h}_{min,final}$, of $\underline{h}_{final}$, (iii) forming a matched filter $\underline{h}_{ap,final}{}^{matched}$ from the all pass component (signal), $\underline{h}_{ap,final}$, of $\underline{h}_{final}$, and filtering this matched filter with the inverse of the minimum phase signal $\underline{h}_{min,final}$. The matched filter may be determined, from the all-pass signal as follows:

$$h_{ap,final}{}^{matched}(n)=h_{ap,final}(-n+\Delta)$$

Δ is a delay term and it may be greater than zero. In essence, the matched filter is formed by time-domain reversal and delay of the all-pass signal.

The matched filter for multiple-listener environment can be designed in several different ways: (i) form the matched filter for one listener and use this filter for all listeners, (ii) use an adaptive learning algorithm (e.g., recursive least squares, an LMS algorithm, neural networks based algorithm, etc.) to find a "global" matched filter that best fits the matched filters for all listeners, (iii) use an adaptive learning algorithm to find a "global" all-pass signal, the resulting global signal may be time-domain reversed and delayed to get a matched filter.

Figure 7:
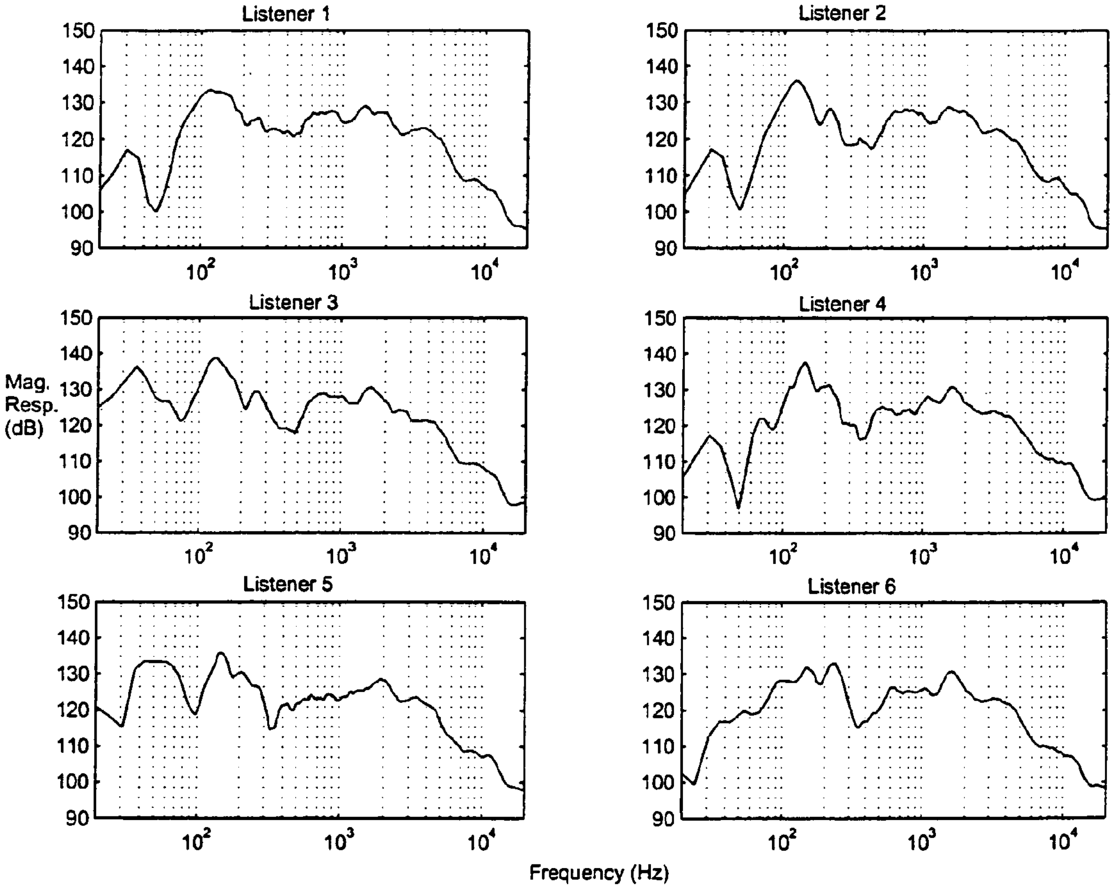
FIG. 7 shows the original frequency response plots obtained at six listener positions (with one loudspeaker)

FIG. 7 shows the frequency response plots obtained on using the room acoustical correction filter for one loudspeaker and six listener positions according to one aspect of the present invention. Only one set of loudspeaker to multiple-listener acoustical responses are shown for simplicity. Large spectral deviations and significant variation in the envelope structure can be seen clearly due to the differences in acoustical characteristics at the different listener positions.

Figure 8:
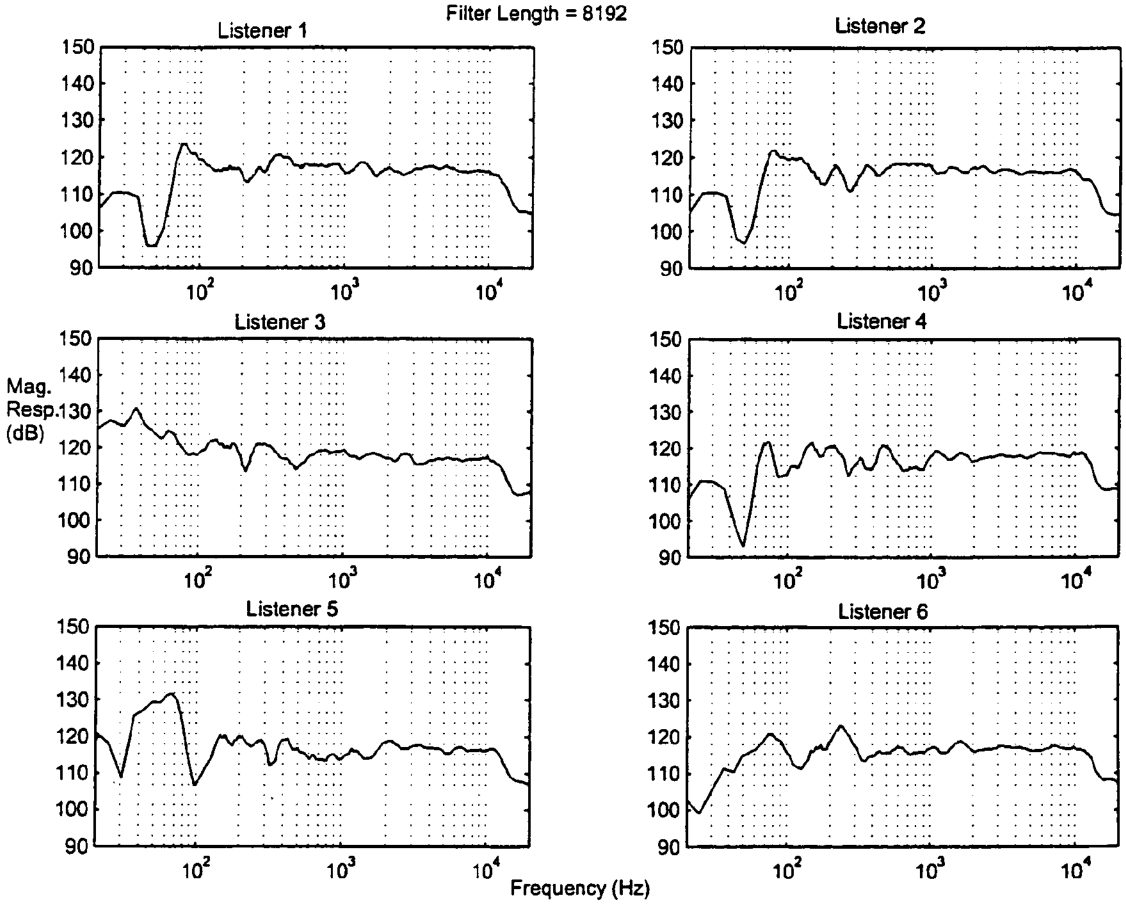
FIG. 8 shows the corrected (equalized) frequency response plots on using the room acoustical correction filter according to one aspect of the present invention.
Figure 9:
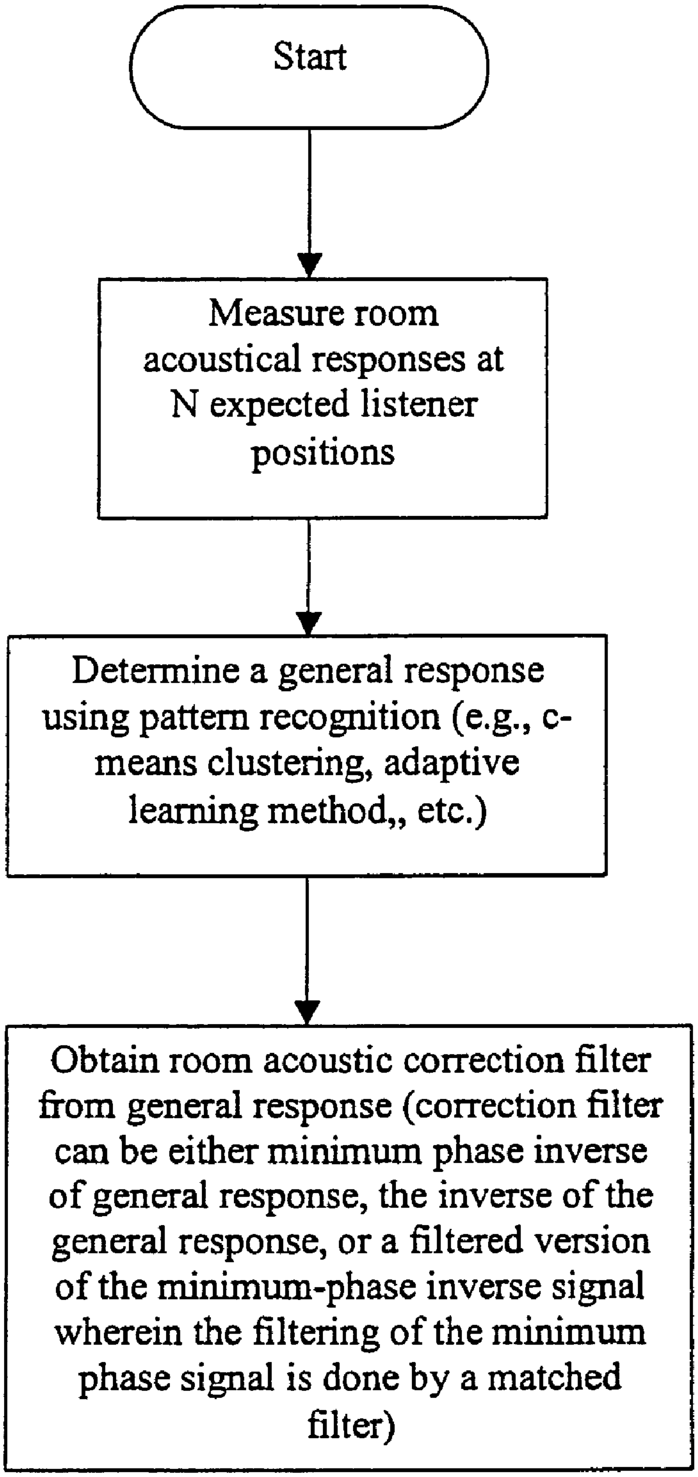
FIG. 9 is a flow chart to determine the room acoustical correction filter according to one aspect of the invention.
Figure 10:
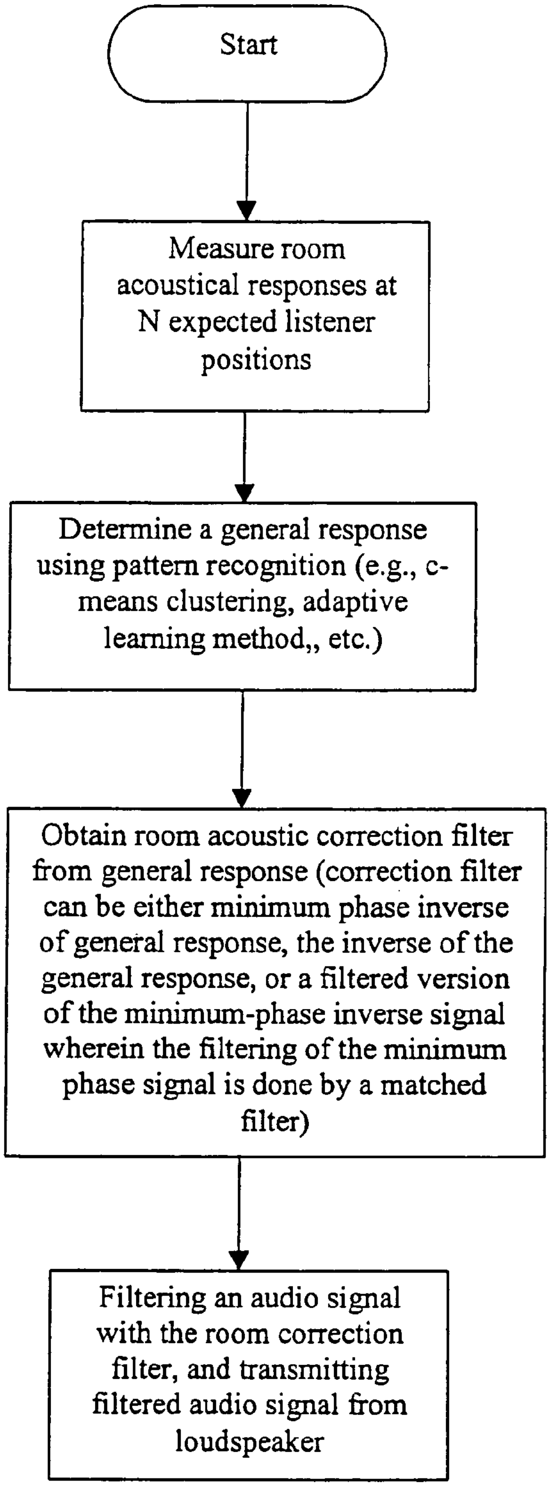
FIG. 10 is a flow chart to determine the room acoustical correction filter according to another aspect of the invention.
Figure 11:
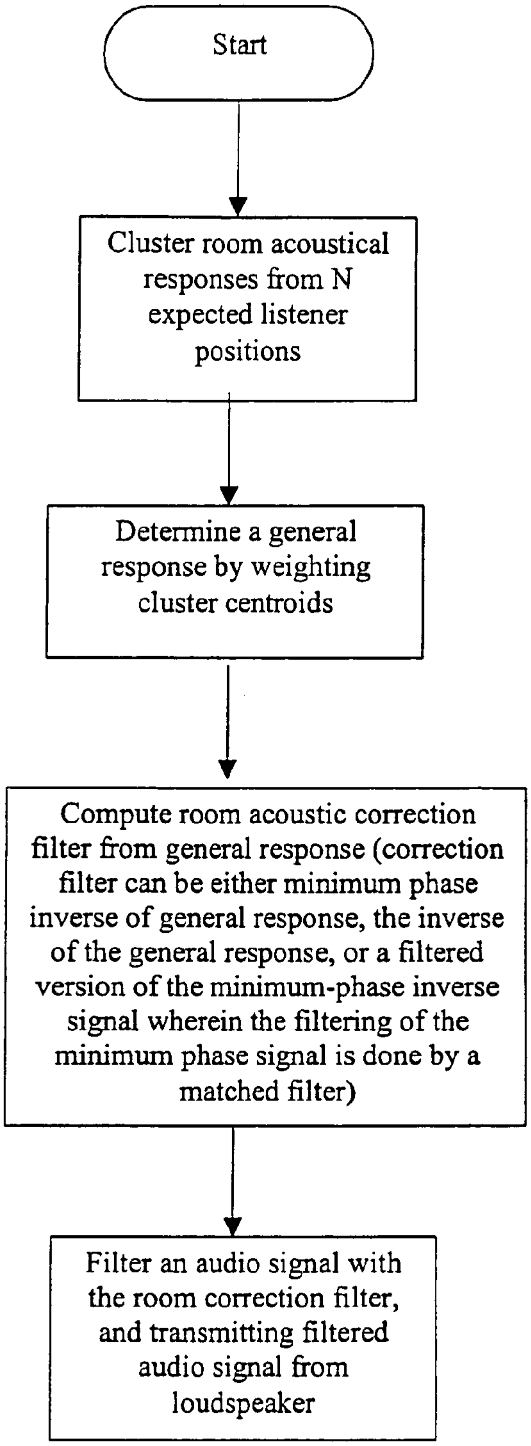
FIG. 11 is a flow chart to determine the room acoustical correction filter according to another aspect of the invention.
Figure 12:
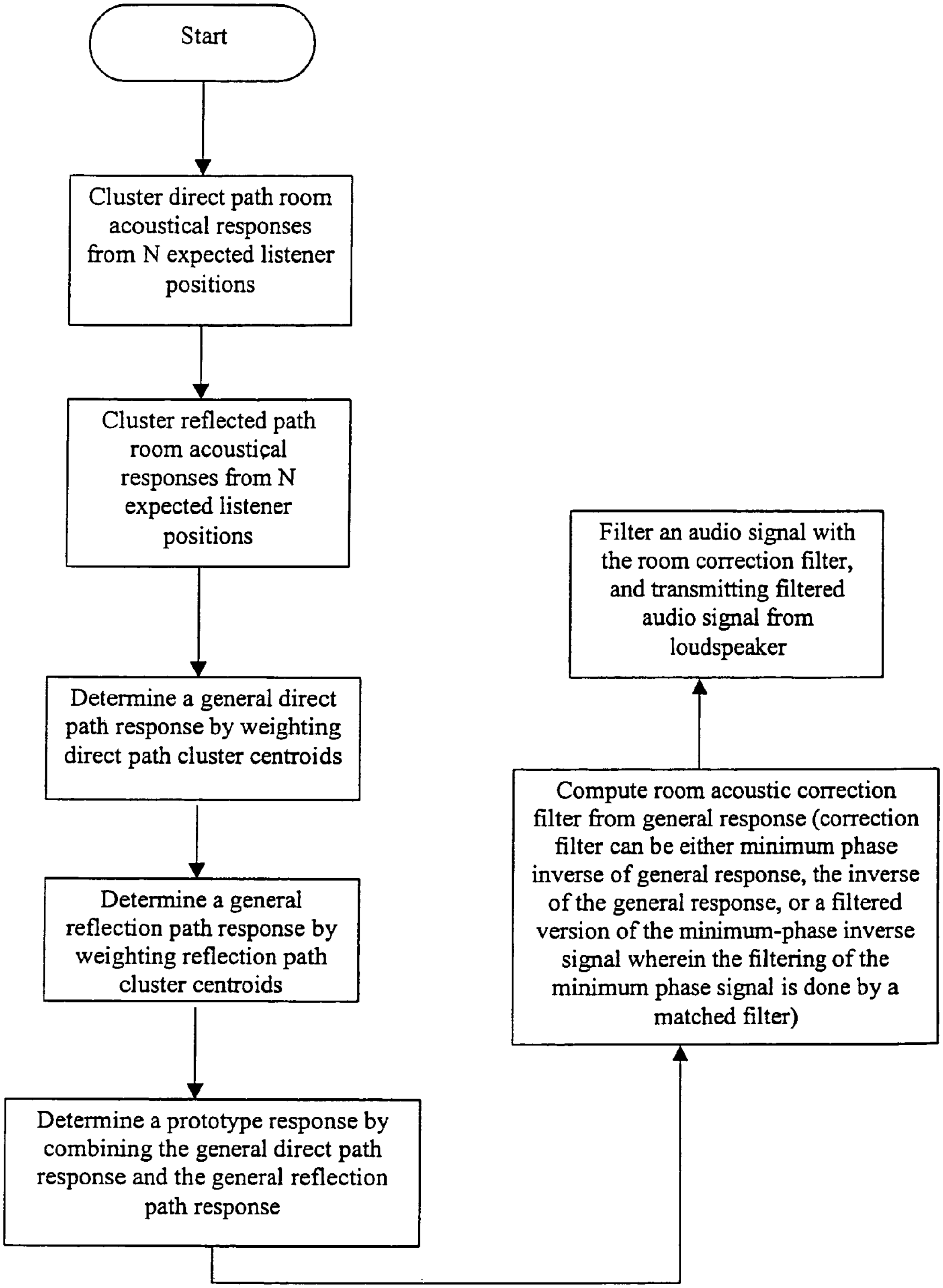
FIG. 12 is a flow chart to determine the room acoustical correction filter according to another aspect of the invention.

FIG. 8 shows the corrected (equalized) frequency response plots on using the room acoustical correction filter according to one aspect of the present invention (viz., inverting the minimum phase part, $\underline{h}_{min,final}$, of $\underline{h}_{final}$, to form the correction filter). Clearly, the spectral deviations have been substantially minimized at all of the six listener positions, and the envelope is substantially uniform or flattened thereby substantially eliminating or reducing the distortions of a loudspeaker transmitted audio signal. This is because the multiple-listener room acoustical correction filter compensates for the poor acoustics at all listener positions simultaneously.

FIGS. 9-12 are the flow charts for four exemplary depictions of the invention.

In another embodiment of the present invention, the pattern recognition technique can be used to cluster the direct path responses separately, and the reflective path components separately. The direct path centroids can be combined to form a general direct path response, and the reflective path centroids may be combined to form the general reflective path response. The direct path general response and the reflective path general response may be combined through a weighted process. The result can be used to determine the multiple-listener room acoustical correction filter (either by inverting the result, or the stable component, or via matched filtering of the stable component).

The filter in the above case was an 8192 finite impulse response (FIR) filter. This filter was obtained from 8192-coefficient impulse responses sampled at 48 kHz sampling frequency. In order for realizable filters that can be implemented in a cost effective manner for real-time DSP applications (e.g., home-theater, automobiles, etc.), the number of filter coefficients should be substantially reduced without substantial changes in the results (subjective and objective).

Figure 20:
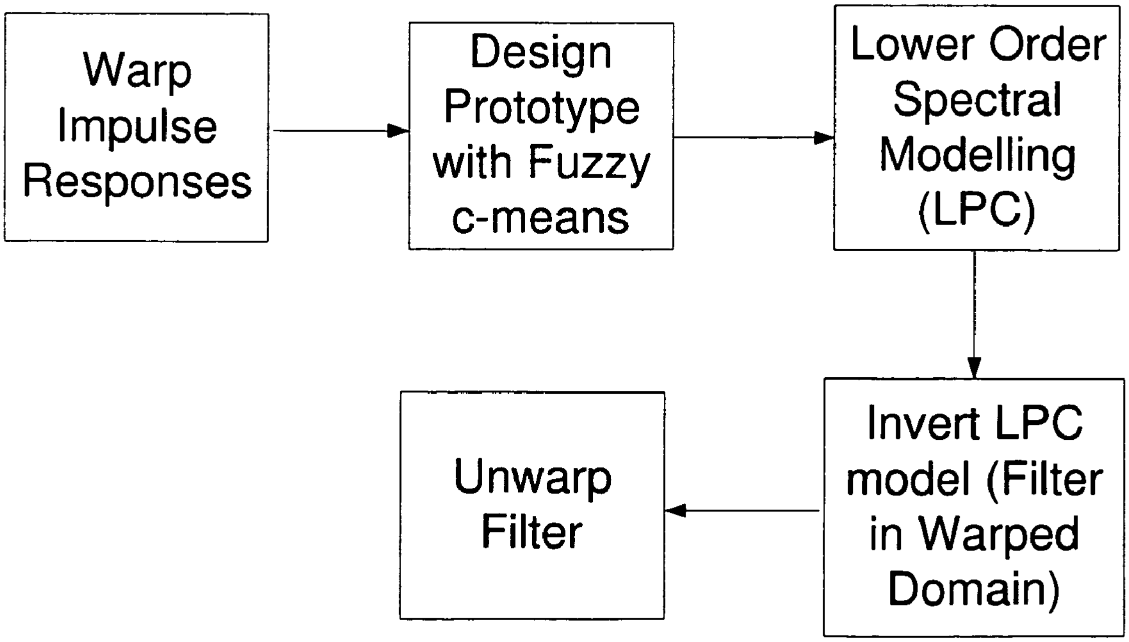
FIG. 20 is a block diagram for achieving low filter orders for performing multiple-listener equalization according to one aspect of the present invention.

Accordingly, in one embodiment of the present invention, a lower order multiple location (listener) equalization filter is designed by (i) warping the room responses to the Bark scale using the concepts from, (ii) performing data clustering to determine similarities between room responses (essentially a non-uniform weighting approach) for finding a "prototype" response, (iii) fitting a lower order spectral model (e.g., a pole zero model or an LPC model), (iv) inverting the LPC model to determine a filter in the warped domain, and (v) unwarping the filter onto the linear axis to get the equalizing filter. FIG. 20 is a block diagram for achieving low filter orders for performing multiple-listener equalization according to this aspect of the present invention.

Figure 25:
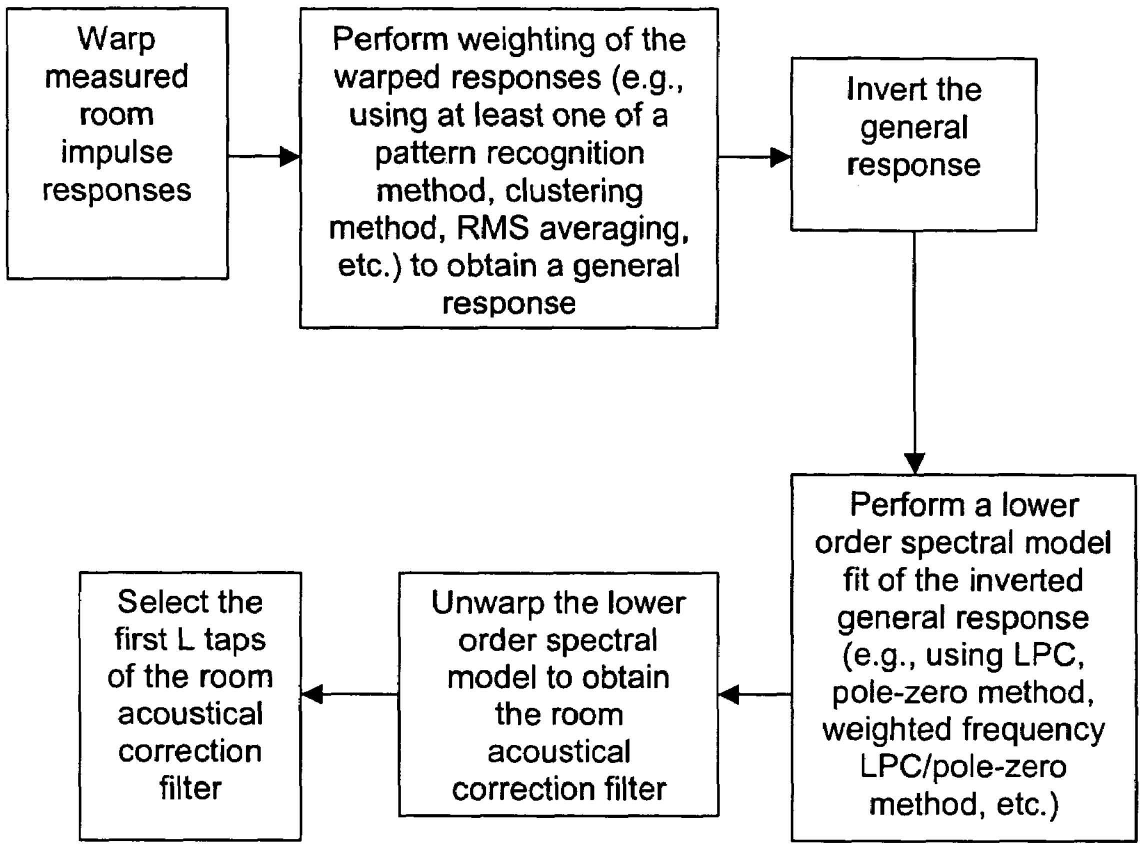
FIG. 25 is a block diagram for achieving low filter orders for performing multiple-listener equalization according to another aspect of the present invention.

Accordingly, in another embodiment of the present invention, a lower order multiple location (listener) equalization filter is designed by (i) warping the room responses to the Bark scale using the concepts from, (ii) performing data clustering to determine similarities between room responses (essentially a non-uniform weighting approach) for finding a "prototype" response, (iii) inverting the prototype response as found y the non-uniform weighting approach of the clustering algorithm, (iv) fitting a lower order spectral model (e.g., a pole zero model or an LPC model) to the prototype (or general) response to form a filter in the warped domain,and (iv) unwarping the filter onto the linear axis to get the equalizing filter. FIG. 25 is a block diagram for achieving low filter orders for performing multiple-listener equalization according to this aspect of the present invention.

Spectral Modelling with LPC:

Linear predictive coding is used widely for modelling speech spectra with a fairly small number of parameters called the predictor coefficients. It can also be applied to model room responses in order to develop low order equalization filters. As shown through the following example, effective low order inverse filters can be formed through LPC modelling.

The error equation e(n), for a signal s(n) (to be modeled by $\tilde{s}(n)$ ), governing the all-pole LPC model of order p and predictor coefficients $a_k$ is expressed as:

$$e(n) = s(n) - s(\tilde{n}) = s(n) - \sum_{k=1}^{p} a_k s(n-k)$$

Figure 13:
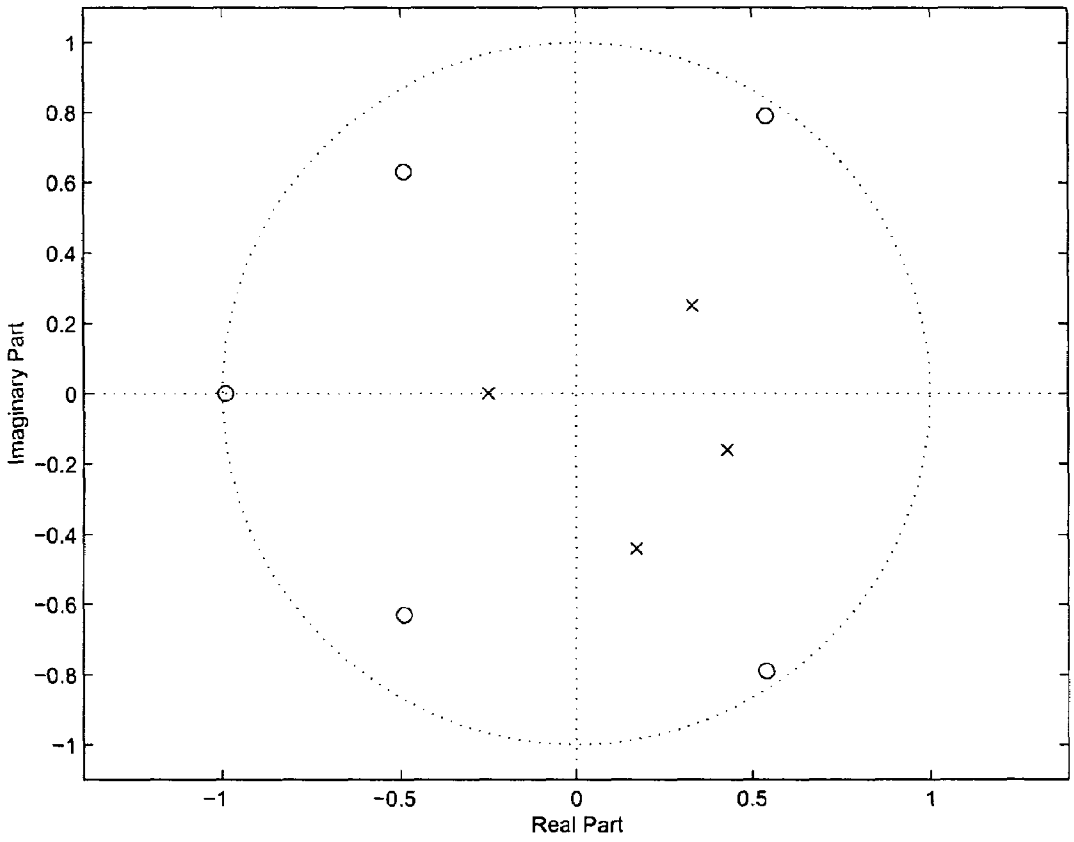
FIG. 13 is a pole zero plot of a signal to be modeled using Linear Predictive Coding (LPC)
Figure 14:
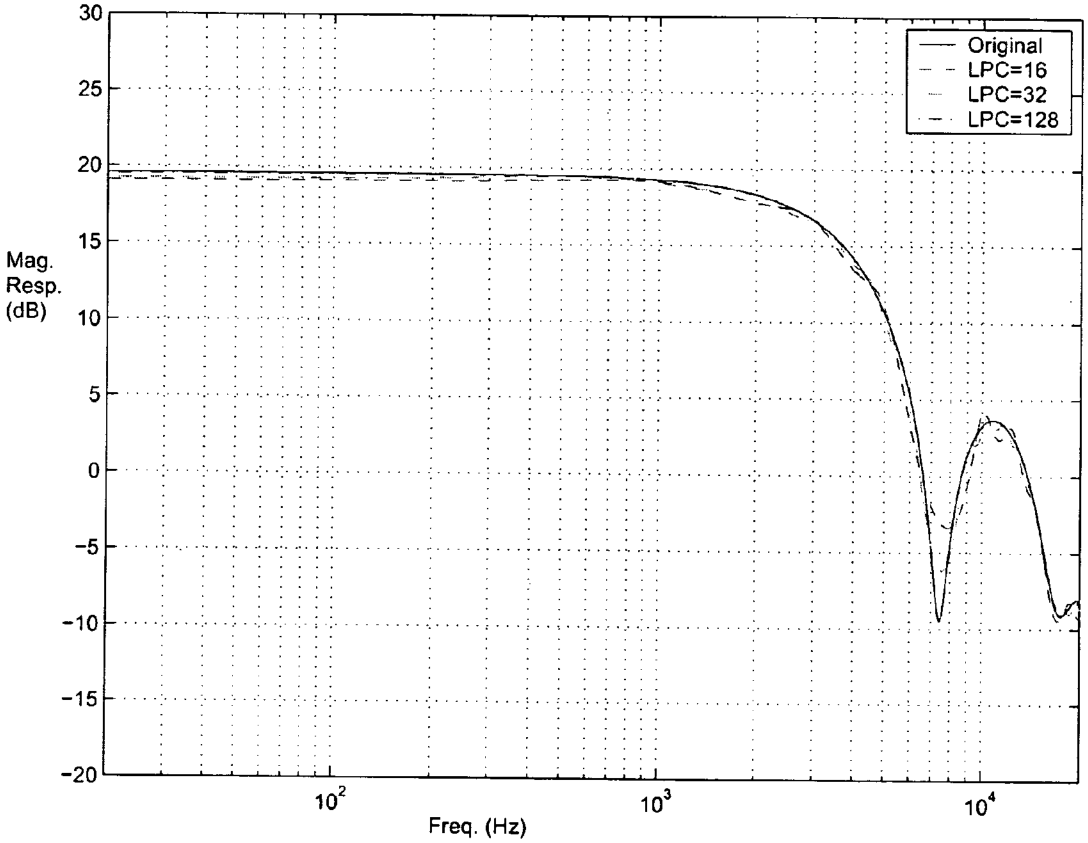
FIG. 14 is a plot depicting the frequency response of the signal of FIG. 13 along with the approximation of the response with various order of the LPC algorithm.

Specifically, FIG. 13 shows a stable minimum phase signal having five zeros and four poles, whereas FIG. 14 is a plot depicting the frequency response of the signal of FIG. 13 along with the approximation of the response with various orders (i.e., number of predictor coefficients being 16, 32, and 128) of the LPC algorithm.

The LPC transfer function $H_1(z)$, which employs an all-pole model, that approximates the signal, s(n), transform S(z) is expressed as:

$$H_1(z) = \frac{K}{\sum_{k=1}^{p} a_k z^{-k}}$$

where K is an appropriate gain term. Alternative models (such as pole-zero models) can be used, and these are expressed as:

$$H_2(z) = \frac{\sum_{l=1}^{r} b_k z^{-k}}{\sum_{k=1}^{p} a_k z^{-k}}$$

In addition, the all-pole (LPC) model $H_1(z)$ and/or the pole-zero model $H_2(z)$ can be frequency weighted to approximate the signal transform S(z) selectively in specific frequency regions using the following objective function that is to be minimized with respect to θ and the frequency weighting term $W(e^{j\omega})$ $$J(\theta) = \|A(e^{j\omega})S(e^{j\omega}) - B(e^{j\omega})\|_2^2 W(e^{j\omega})$$

where:

$$A(z) = \frac{K_1}{\sum_{k=1}^{p} a_k z^{-k}};\; B(z) = \sum_{l=1}^{r} b_k z^{-k};\; \theta = [a_1, \ldots, a_p, b_1, \ldots, b_r]$$

Figure 15:
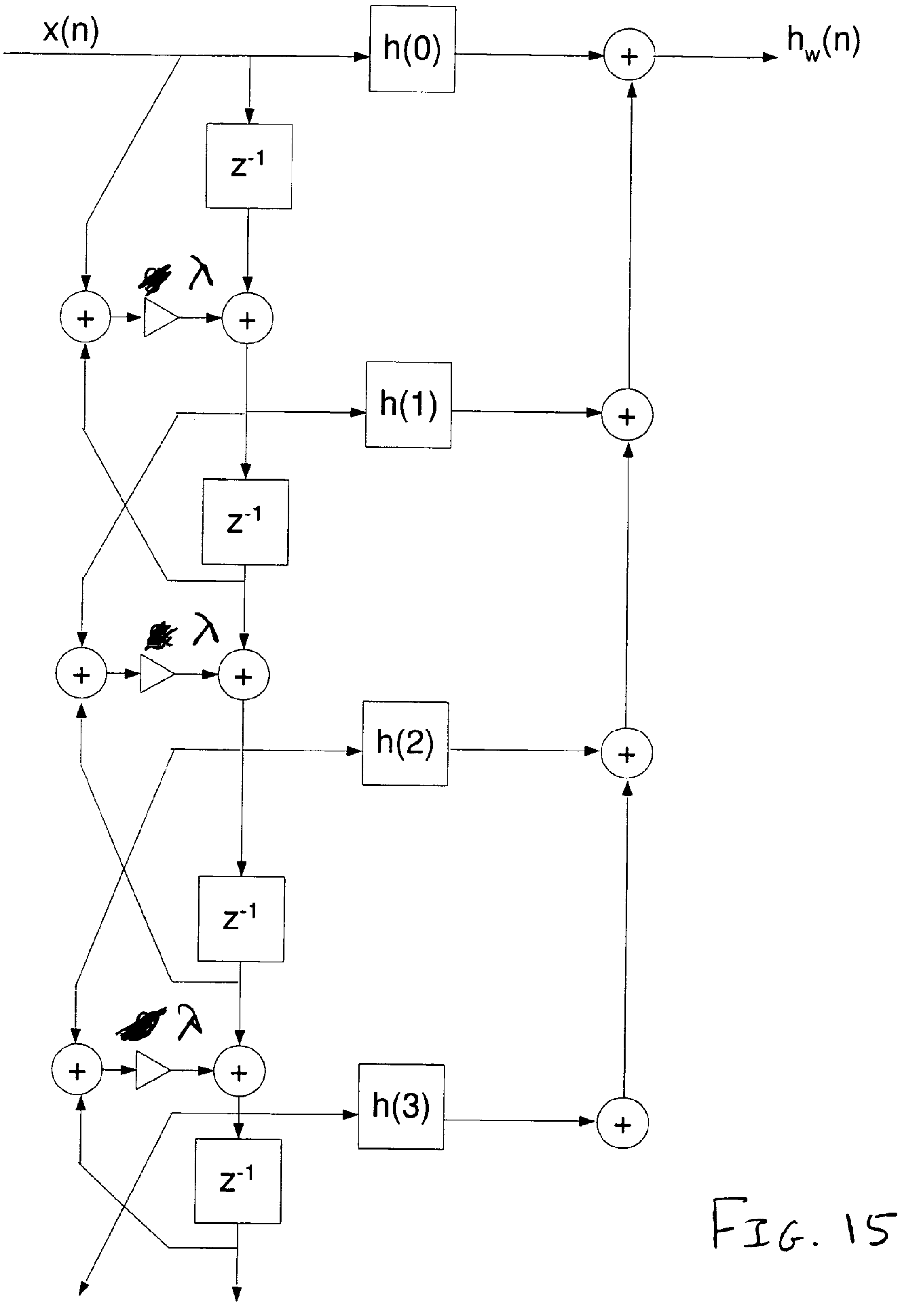
FIG. 15 shows the implementation for warping a room acoustical response.

FIG. 15 shows the implementation for warping, through the bilinear conformal map, a room acoustical response using an all-pass filter chain. The basic idea for warping is done using an FIR chain having all-pass blocks (with all-pass or warping coefficients λ), instead of conventional delay elements. When an all-pass filter, $D_1(z)$, is used, the frequency axis is warped and the resulting frequency response is obtained at non-uniformly sampled points along the unit circle. Thus, for warping $$D_1(z) = \frac{z^{-1} - \lambda}{1 - \lambda z^{-1}}$$

The group delay of $D_1(z)$ is frequency dependent, so that positive values of the warping coefficient λ yield higher frequency resolutions in the original response for low frequencies, whereas negative values of λ yield higher resolutions in the frequency response at high frequencies.

Clearly, the cascade chain of all-pass filters result in an infinite duration sequence. Typically a windowing is employed that truncates this infinite duration sequence to a finite duration to yield an approximation.

Warping via a bilinear conformal map and based on the all-pass transformation to the psycho-acoustic Bark frequency scale can be obtained by the following relation between the warping parameter λ and the sampling frequency $f_s$:

$$\lambda = 0.8517[\arctan(0.06583 f_s)]^{1/2} - 0.1916$$

Figure 16:
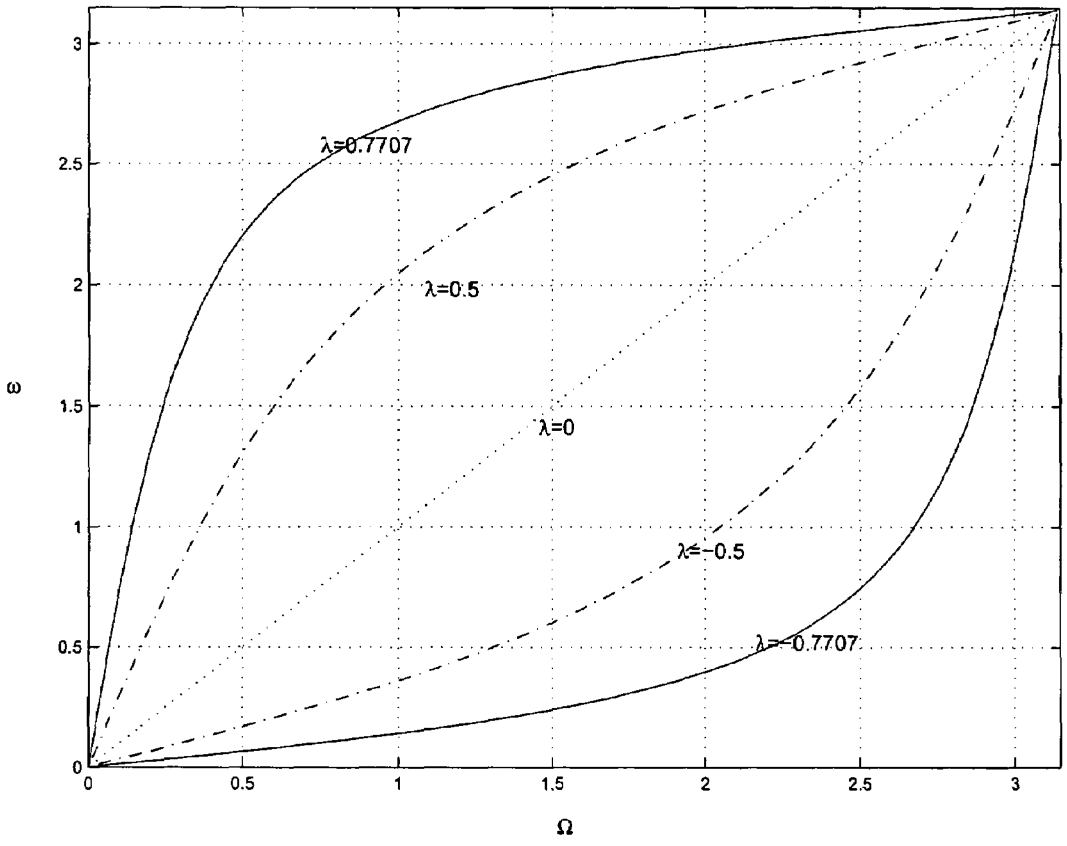
FIG. 16 is a figure showing different curves associated with different warping parameters for frequency axis warping.

FIG. 16 is a figure showing different curves associated with different warping parameters, λ, for transformation of the frequency response via frequency warping. Positive values of the warping parameter map low frequencies to high frequencies (which translates into stretching the frequency response), where negative values of the warping parameter map high frequencies to low frequencies. During the unwarping stage the warping parameter is selected to be $-\lambda$.

Figure 17:
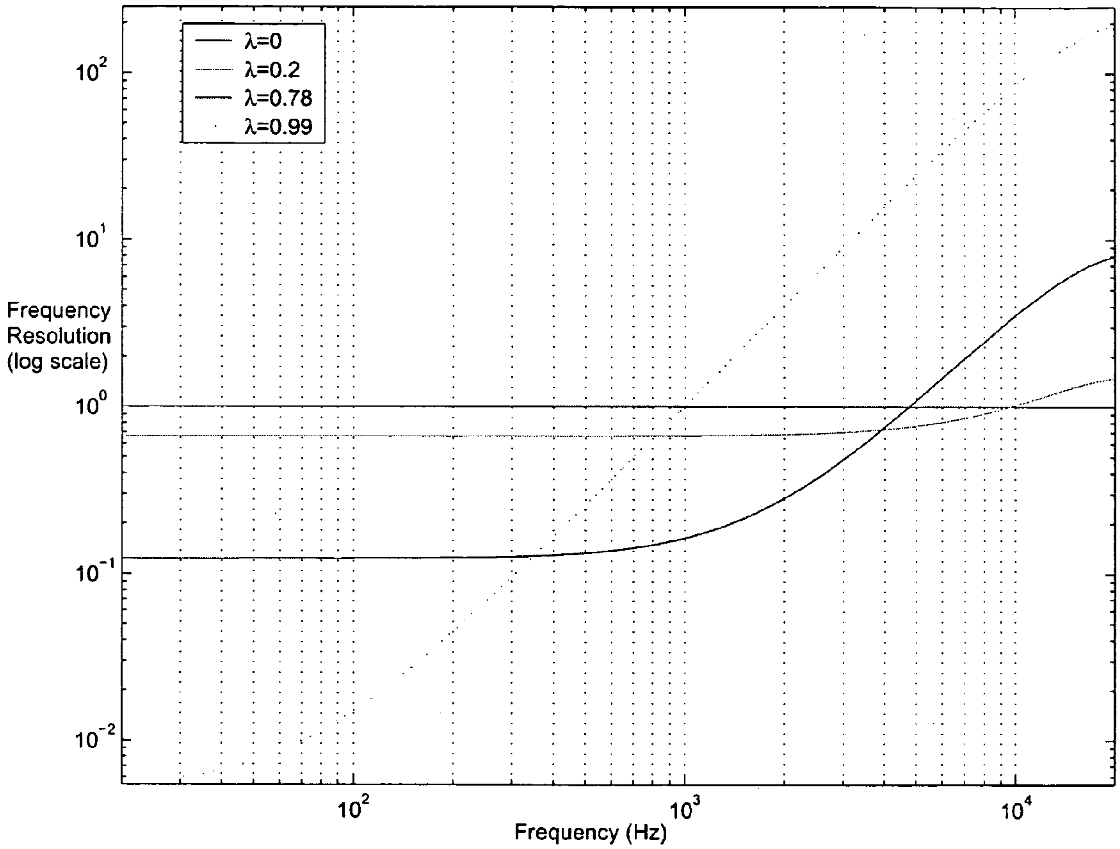
FIG. 17 is a figure showing different frequency resolutions achieved for different warping parameters.

FIG. 17 is a figure showing different frequency resolutions for positive warping parameters.

Figure 18:
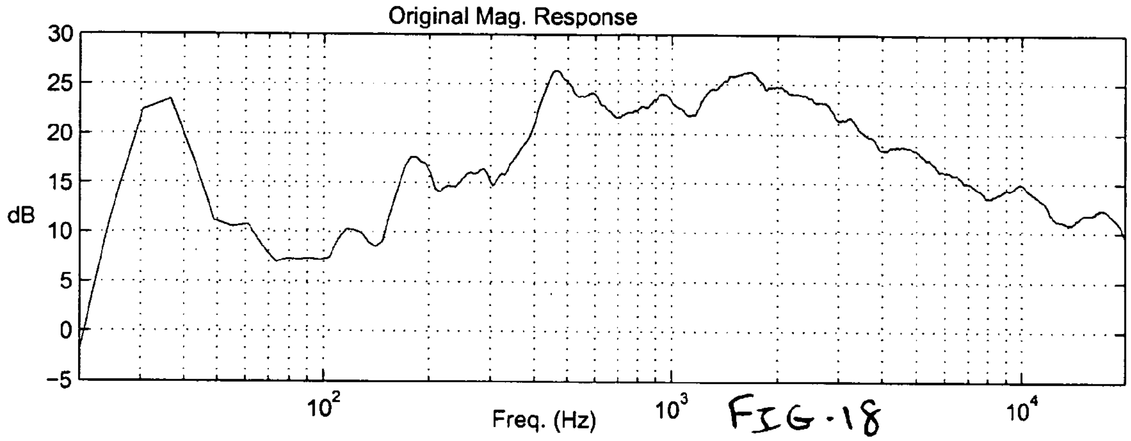
FIG. 18 is an example of a magnitude response of an acoustical impulse response.
Figure 19:
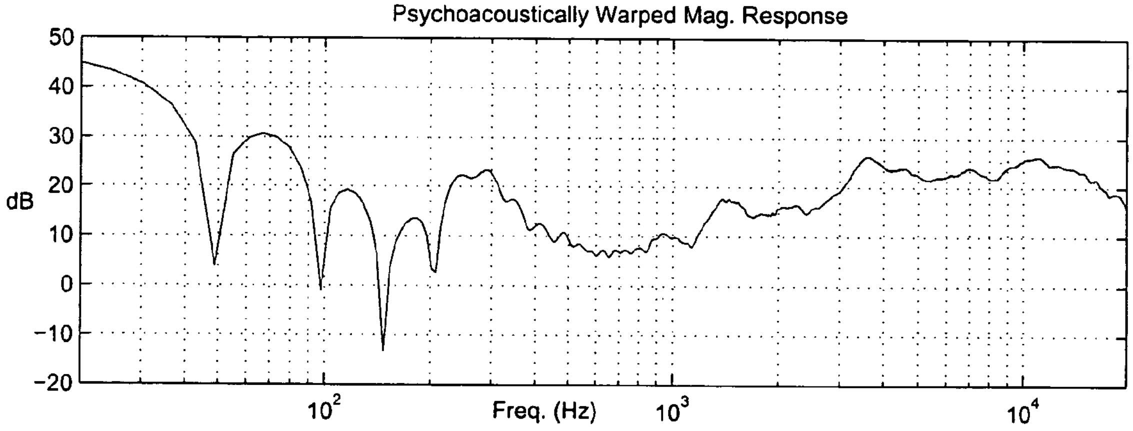
FIG. 19 is the warped magnitude response corresponding to the magnitude response in FIG. 18.

FIG. 18 is an example of a magnitude response of an acoustical impulse response, whereas FIG. 19 is the warped magnitude response corresponding to the magnitude response in FIG. 18 (with $\lambda=0.78$).

FIG. 20 is a block diagram for achieving low filter orders for performing multiple-listener equalization according to one aspect of the present invention, showing several steps. The first step involves measuring the room impulse response at each of the expected listener positions. Subsequently, the room responses are warped based on the warping parameter $\lambda$ before lower order spectral fitting. Warping is important since it is important to get a good resolution, particularly at lower frequencies, so that the lower order LPC spectral model, used in the subsequent stage, can achieve a good fit to a frequency response in the lower frequencies (below 6 kHz). After warping each response, weighting, using some non-uniform weighting method or by a pattern recognition method or fuzzy clustering method or through a simple energy averaging (i.e., root-mean-square RMS averaging) method, is done to the warped responses to obtain a general response or a prototype response (e.g., as in paragraph [0080] where $\underline{h}_k$ are the warped responses and the general response in the warped domain is $\underline{\textcircled{h}}_i{}^*$). After determining the general response, a lower order model (e.g., the LPC model, a pole-zero model, a frequency weighted LPC or pole-zero model) may be used to model the general response with a small number of coefficients (e.g., the predictor coefficients $a_k$). The resulting impulse response from the LPC model is then inverted to get a filter in the warped domain. An unwarping stage, with warping parameter $-\lambda$, unwarps the frequency response of the filter in the warped domain to give a room acoustical correction filter in the linear frequency domain. The first L taps of the room acoustical correction filter are selected (where $L<P$, P being the length of the room response). Thus, conventional Fast Fourier Transform algorithms may be used for real-time signal processing and filtering with the L taps of the room acoustical correction filter.

Figure 21:
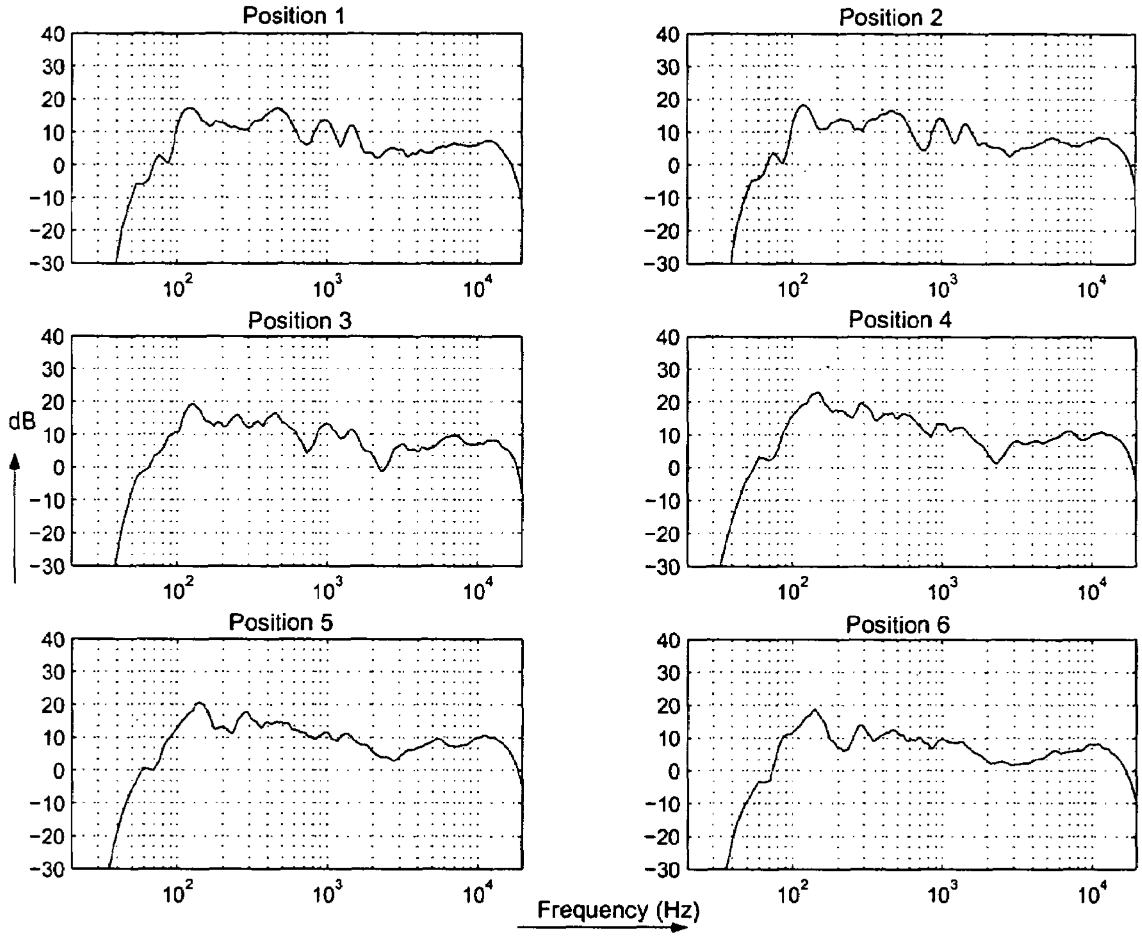
FIG. 21 are exemplary frequency response plots obtained at six listener positions.
Figure 22:
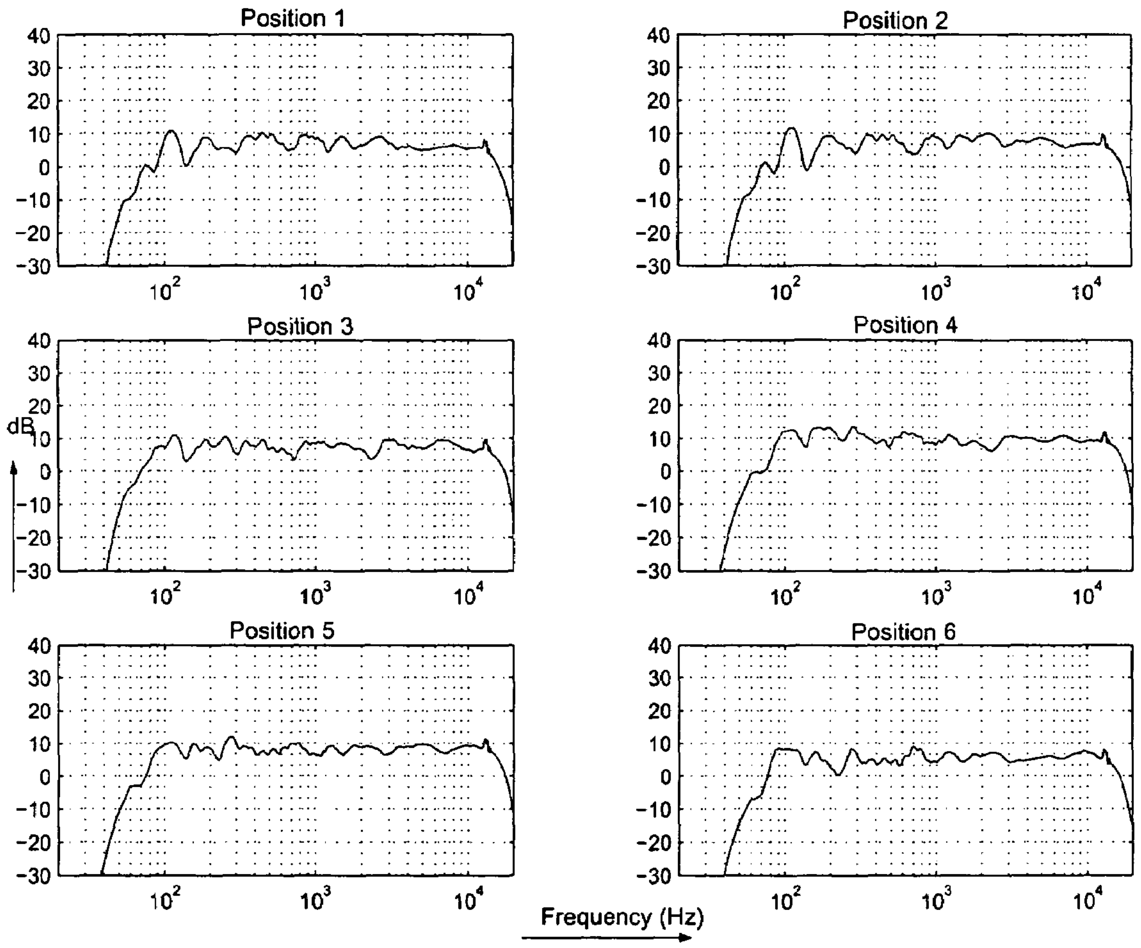
FIG. 22 show the frequency response plots at the six listener positions of FIG. 21 that were corrected by using 512 tap room acoustical correction filter according to one aspect of the present invention.

FIG. 21 are exemplary frequency response plots obtained at six listener positions in a room for one loudspeaker, whereas FIG. 22 shows the frequency response plots at the six listener positions of FIG. 21 that were corrected by using $L=512$ tap room acoustical correction filter (with $k=512$ predictor coefficients in the LPC) according to one aspect of the present invention using $\lambda=0.78$. Each subplot, in each figure, corresponds to the frequency response at one listener position. Clearly, there is a significant amount of correction as the room correction filter minimizes the magnitudes of the peaks and dips that cause significant degradation in the perceived audio quality. The resulting frequency response at the six listener positions is substantially flat as can be seen through FIG. 22.

Figure 23:
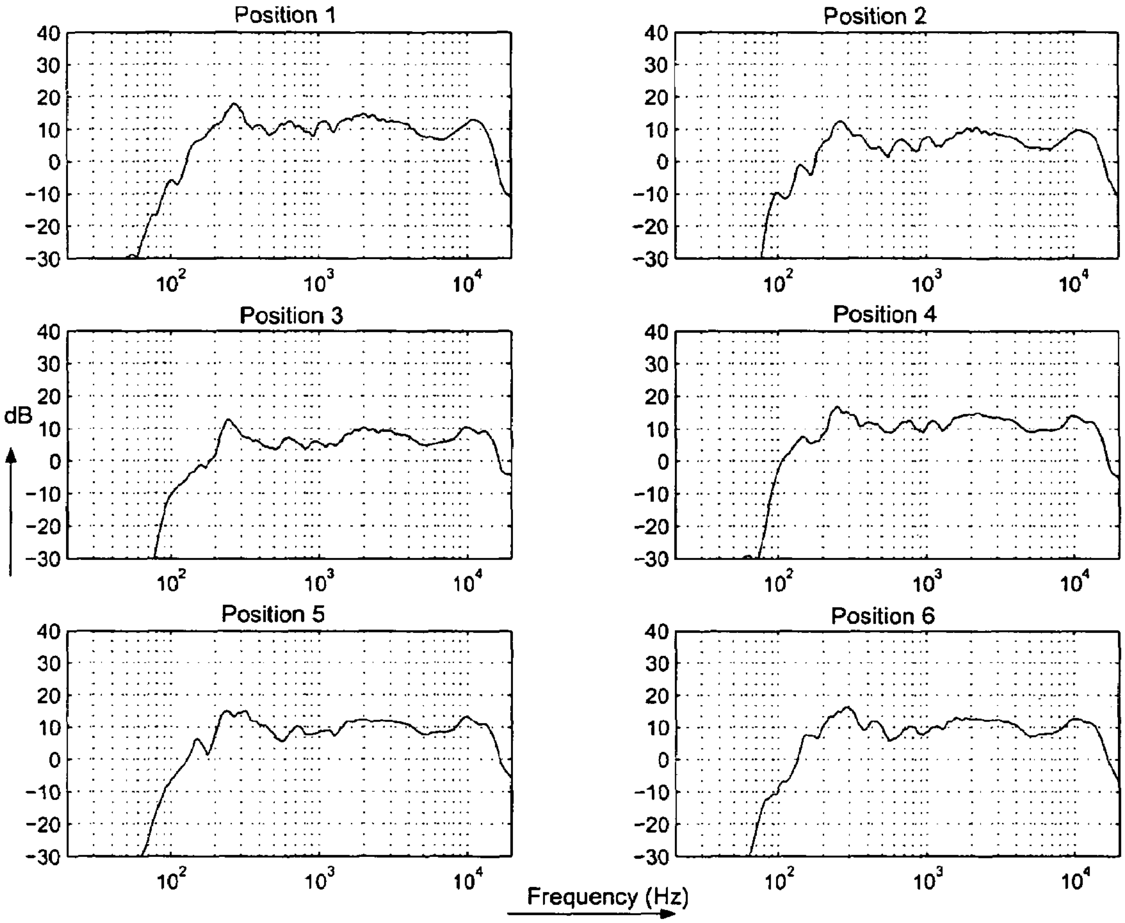
FIG. 23 are exemplary frequency response plots obtained at six listener positions.
Figure 24:
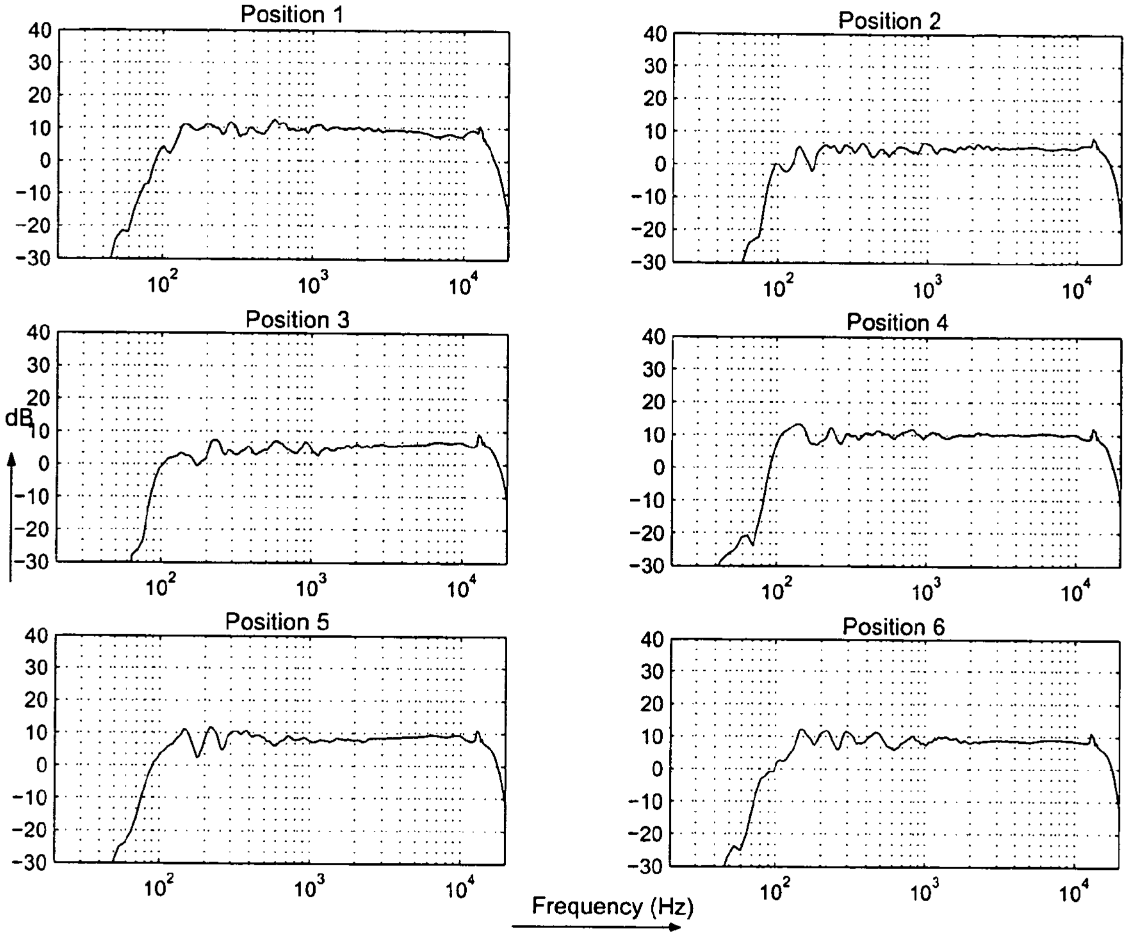
FIG. 24 show the frequency response plots at the six listener positions of FIG. 23 that were corrected by using 512 tap room acoustical correction filter according to one aspect of the present invention.

FIG. 23 are exemplary frequency response plots for another system in a room obtained at six listener positions for another loudspeaker, whereas FIG. 24 show the frequency response plots at the six listener positions of FIG. 23 that were corrected by using $L=512$ tap room acoustical correction filter according to one aspect of the present invention.

FIG. 25 is a block diagram for achieving low filter orders for performing multiple-listener equalization according to another aspect of the present invention. In this embodiment, the inverse filter is first determined using at least the minimum phase part of the prototype response. A lower order spectral model (e.g., LPC) is then fitted to the inverse response to obtain a lower order warped filter. The warped filter is unwarped to get the room acoustical correction filter in the linear frequency domain. The first L taps of this filter may be selected for real-time room acoustical equalization.

The description of exemplary and anticipated embodiments of the invention has been presented for the purposes of illustration and description purposes. They are not intended to be exhaustive or to limit the invention to the precise forms disclosed. Many modifications and variations are possible in light of the teachings herein. For example, the number of loudspeakers and listeners may be arbitrary (in which case the correction filter may be determined (i) for each loudspeaker and multiple-listener responses, or (ii) for all loudspeakers and multiple-listener responses). Additional filtering may be done to shape the final response, at each listener, such that there is a gentle roll-off for specific frequency ranges (instead of having a substantially flat response).

We claim:

1. A method for correcting room acoustics at multiple-listener positions, the method comprising:

measuring with a microphone a room acoustical response at each listener position in a multiple-listener environment;

warping each of the room acoustical response measured at said each listener position;

determining a general response by computing a weighted average of the warped room acoustical responses;

generating a low order spectral model of the general response;

obtaining a warped acoustic correction filter from the low order spectral model, wherein the warped acoustic correction filter is the inverse of the low order spectral model; and unwarping the warped acoustic correction filter to obtain a room acoustic correction filter; wherein the room acoustic correction filter corrects the room acoustics at the multiple-listener positions.

2. The method of claim 1, further comprising generating a stimulus signal for measuring the room acoustical response at each of the listener positions.

3. The method according to claim 1, wherein the general response is determined by a pattern recognition method.

4. The method of claim 3, wherein the pattern recognition method comprises a method selected from a group consisting of: a hard c-means clustering method, a fuzzy c-means clustering method, and an adaptive learning method.

5. The method according to claim 1, wherein the warping is achieved by means of a bilinear conformal map.

6. The method of claim 1, wherein the spectral model comprises a model selected from a group consisting of a Linear Predictive Coding (LPC) model and a pole-zero model.

7. A method for generating substantially distortion-free audio at multiple-listeners in an environment, the method comprising:

measuring with a microphone acoustical characteristics of the environment at each expected listener position in the multiple-listener environment;

warping each of the acoustical characteristics measured at said each expected listener position;

generating a low order spectral model of each of the warped acoustical characteristics;

obtaining a warped acoustic correction filter from the low order spectral model, wherein the warped acoustic correction filter is the inverse of the low order spectral model;

unwarping the warped acoustic correction filter to obtain a room acoustic correction filter;

filtering an audio signal with the room acoustical correction filter; and transmitting the filtered audio from at least one loudspeaker, wherein the audio signal received at said each expected listener position is substantially free of distortions.

8. The method of claim 7, further comprising determining a general response by a pattern recognition method.

9. The method of claim 8, wherein the pattern recognition method comprises a method selected from a group consisting of: a hard c-means clustering method, a fuzzy c-means clustering method, and an adaptive learning method.

10. The method of claim 7, wherein the warping is achieved by a bilinear conformal map.

11. The method of claim 7, wherein the spectral model comprises a model selected from a group consisting of: a Linear Predictive Coding (LPC) model and a frequency weighted pole-zero model.

12. A system for generating substantially distortion-free audio at multiple-listeners in an environment, the system comprising:

a filtering means for performing multiple-listener room acoustic correction, the filtering means formed from:

(i) warped room acoustical responses, wherein the room acoustical responses are measured with a microphone at each of an expected listener position in a multiple-listener environment;

(ii) a weighted average response of the warped room acoustical responses;

(iii) a low order spectral model of the weighted average response;

(iv) a warped filter formed from the low order spectral model, wherein the warped filter is the inverse of the low order spectral model; and (v) an unwarped room acoustic correction filter obtained by unwarping the warped filter; wherein an audio signal, filtered by the filtering means comprised of the room acoustic correction filter, is received substantially distortion-free at each of the expected listener positions; and a means for transmitting the audio signal.

13. The system of claim 12, wherein the weighted average response is determined by a pattern recognition means.

14. The system of claim 13, wherein the pattern recognition means comprises a means selected from a group consisting of a hard c-means clustering system, a fuzzy c-means clustering system, and an adaptive learning system.

15. The system of claim 12, wherein the warping is achieved by an all-pass filter chain.

16. The system of claim 12, wherein the spectral model comprises a model selected from a group consisting of a Linear Predictive Coding (LPC) model and a frequency weighted pole-zero model.

17. A method for correcting room acoustics at multiple-listener positions, the method comprising:

warping each room acoustical response, said each room acoustical response obtained with a microphone at each expected listener position;

clustering each of the warped room acoustical response into at least one cluster, wherein each cluster includes a centroid;

forming a general response from the at least one centroid;

inverting the general response to obtain an inverse response;

obtaining a lower order spectral model of the inverse response;

unwarping the lower order spectral model of the inverse response to form the room acoustic correction filter; wherein the room acoustic correction filter corrects the room acoustics at the multiple-listener positions.

18. The method of claim 17, wherein the warping is achieved by a bilinear conformal map.

19. The method of claim 18, wherein the spectral model comprises a frequency weighted pole-zero model.

* * * * *

UNITED STATES PATENT AND TRADEMARK OFFICE

CERTIFICATE OF CORRECTION

PATENT NO. : 7,567,675 B2
APPLICATION NO. : 10/700220
DATED : July 28, 2009
INVENTOR(S) : Bharitkar et al.

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 732 days.

Delete the phrase "by 732 days" and insert -- by 977 days --

Signed and Sealed this

Fourth Day of May, 2010

David J. Kappos
*Director of the United States Patent and Trademark Office*